(12) United States Patent
Hirota

(10) Patent No.: US 8,169,015 B2
(45) Date of Patent: May 1, 2012

(54) SEMICONDUCTOR DEVICE AND MANUFACTURING METHOD THEREFOR

(75) Inventor: Toshiyuki Hirota, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 722 days.

(21) Appl. No.: 12/115,715

(22) Filed: May 6, 2008

(65) Prior Publication Data

US 2009/0146254 A1 Jun. 11, 2009

(30) Foreign Application Priority Data

May 11, 2007 (JP) ................ P2007-126538

(51) Int. Cl.
*H01L 27/108* (2006.01)
*H01L 21/20* (2006.01)

(52) U.S. Cl. . 257/310; 257/309; 257/532; 257/E21.008; 257/E21.013; 257/E21.019; 257/E27.089; 361/15; 361/321.4; 438/239; 438/253; 438/255; 438/396; 438/398; 438/622

(58) Field of Classification Search .......... 257/309, 257/310, 532, E21.008, E21.013, E21.019, 257/E27.089; 361/15, 321.4; 438/239, 253, 438/255, 396, 398, 622
See application file for complete search history.

(56) References Cited

U.S. PATENT DOCUMENTS

| | | | | |
|---|---|---|---|---|
| 5,754,390 A | * | 5/1998 | Sandhu et al. | 361/321.4 |
| 6,385,020 B1 | * | 5/2002 | Shin et al. | 361/15 |
| 6,635,561 B2 | * | 10/2003 | Kawai et al. | 438/622 |
| 6,780,704 B1 | * | 8/2004 | Raaijmakers et al. | 438/239 |
| 2002/0068412 A1 | * | 6/2002 | Lee et al. | 438/398 |

FOREIGN PATENT DOCUMENTS

| | | |
|---|---|---|
| JP | 2003-142605 | 5/2003 |
| JP | 2003-297952 | 10/2003 |

* cited by examiner

*Primary Examiner* — Dao H Nguyen
(74) *Attorney, Agent, or Firm* — Young & Thompson

(57) ABSTRACT

This semiconductor device according to the present invention includes a plurality of cylindrical lower electrodes aligned densely in a memory array region; a plate-like support which is contacted on the side surface of the cylindrical lower electrodes, and links to support the plurality of the cylindrical lower electrodes; a pore portion provided in the plate-like support; a dielectric film covering the entire surface of the cylindrical lower electrodes and the plate-like support in which the pore portion is formed; and an upper electrode formed on the surface of the dielectric film, wherein the boundary length of the part on the side surface of the cylindrical lower electrode which is exposed on the pore portion is shorter than the boundary length of the part on the side surface of the cylindrical lower electrode which is not exposed on the pore portion.

15 Claims, 17 Drawing Sheets

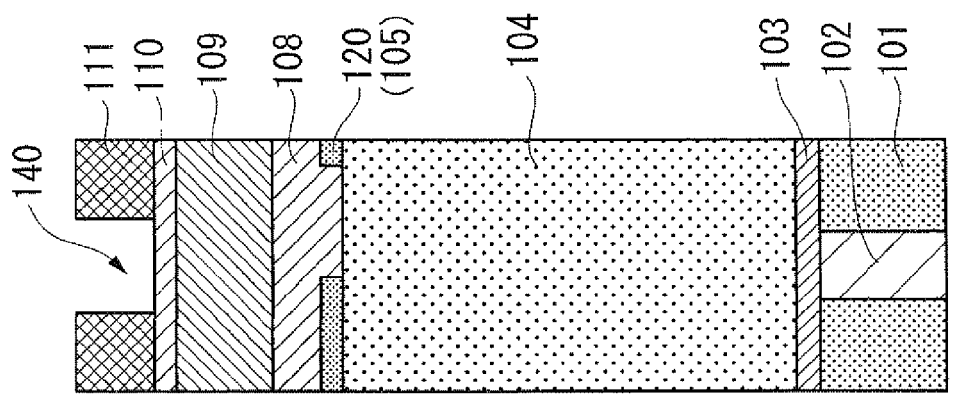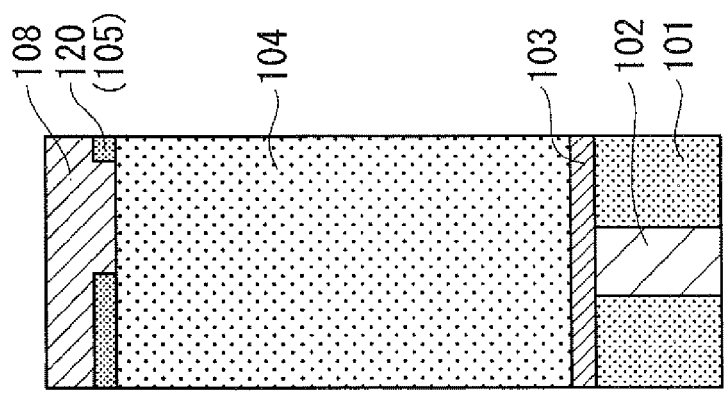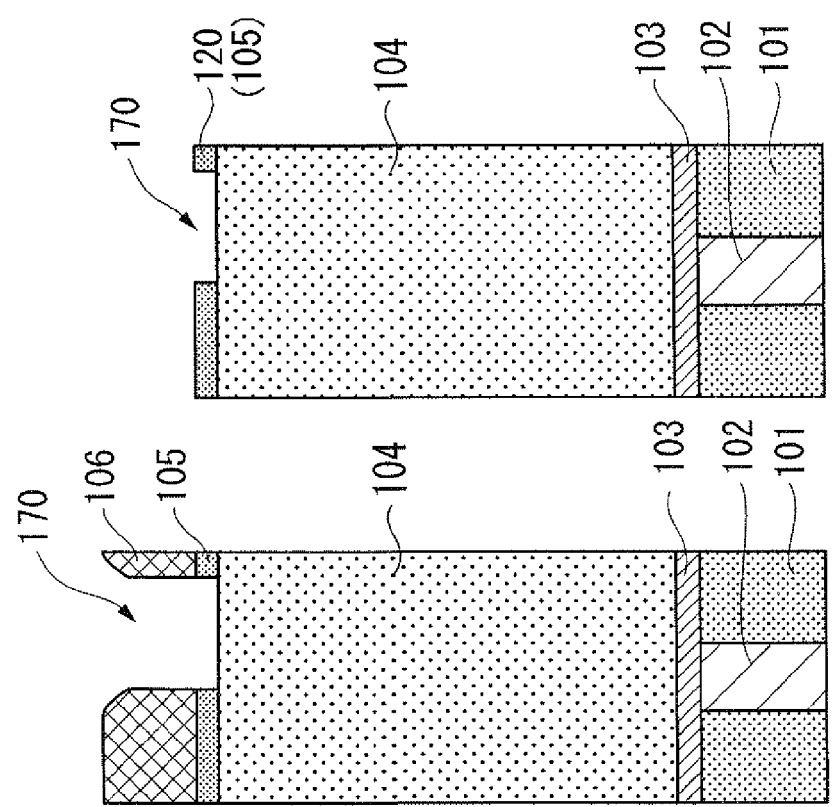

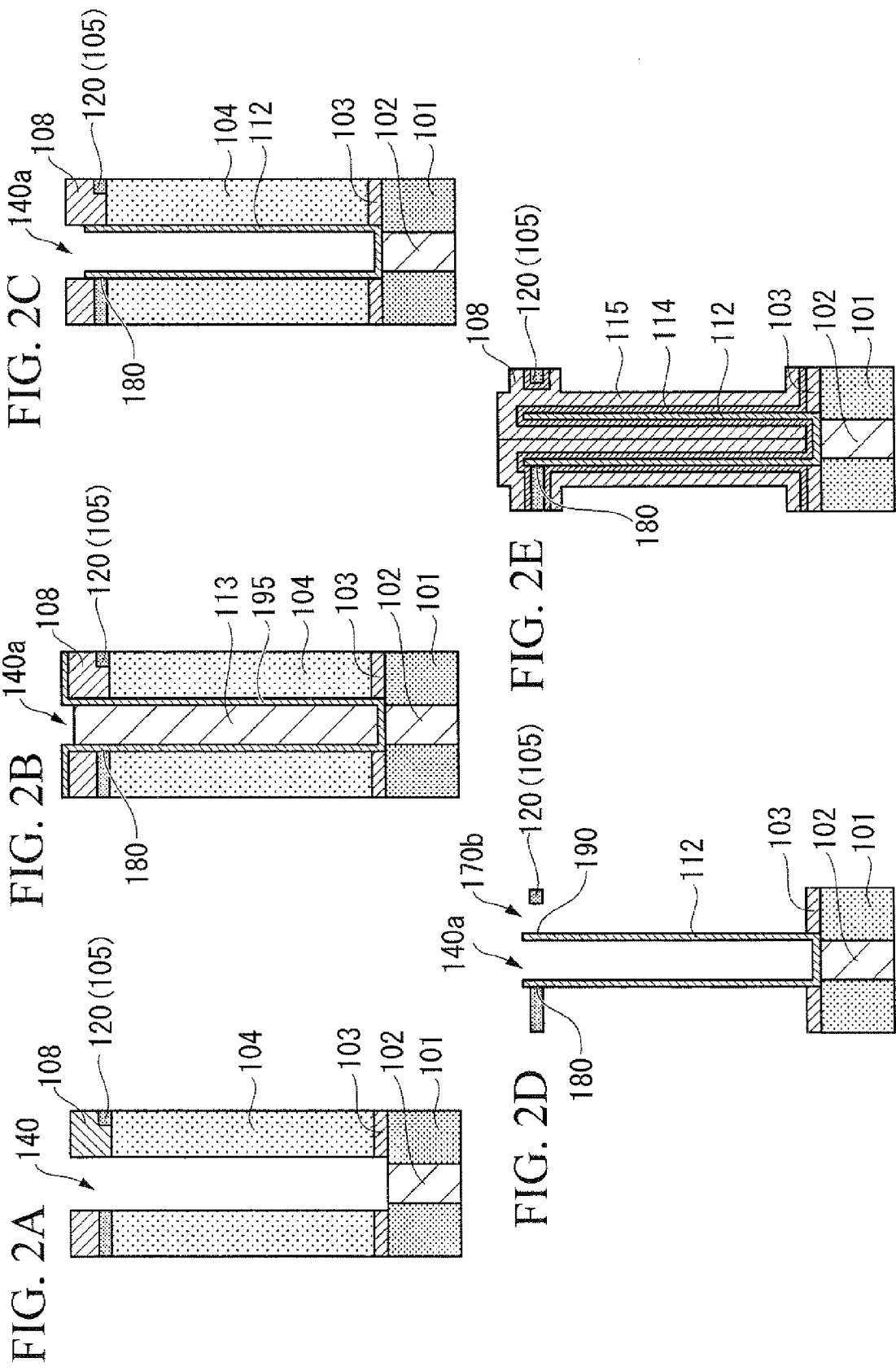

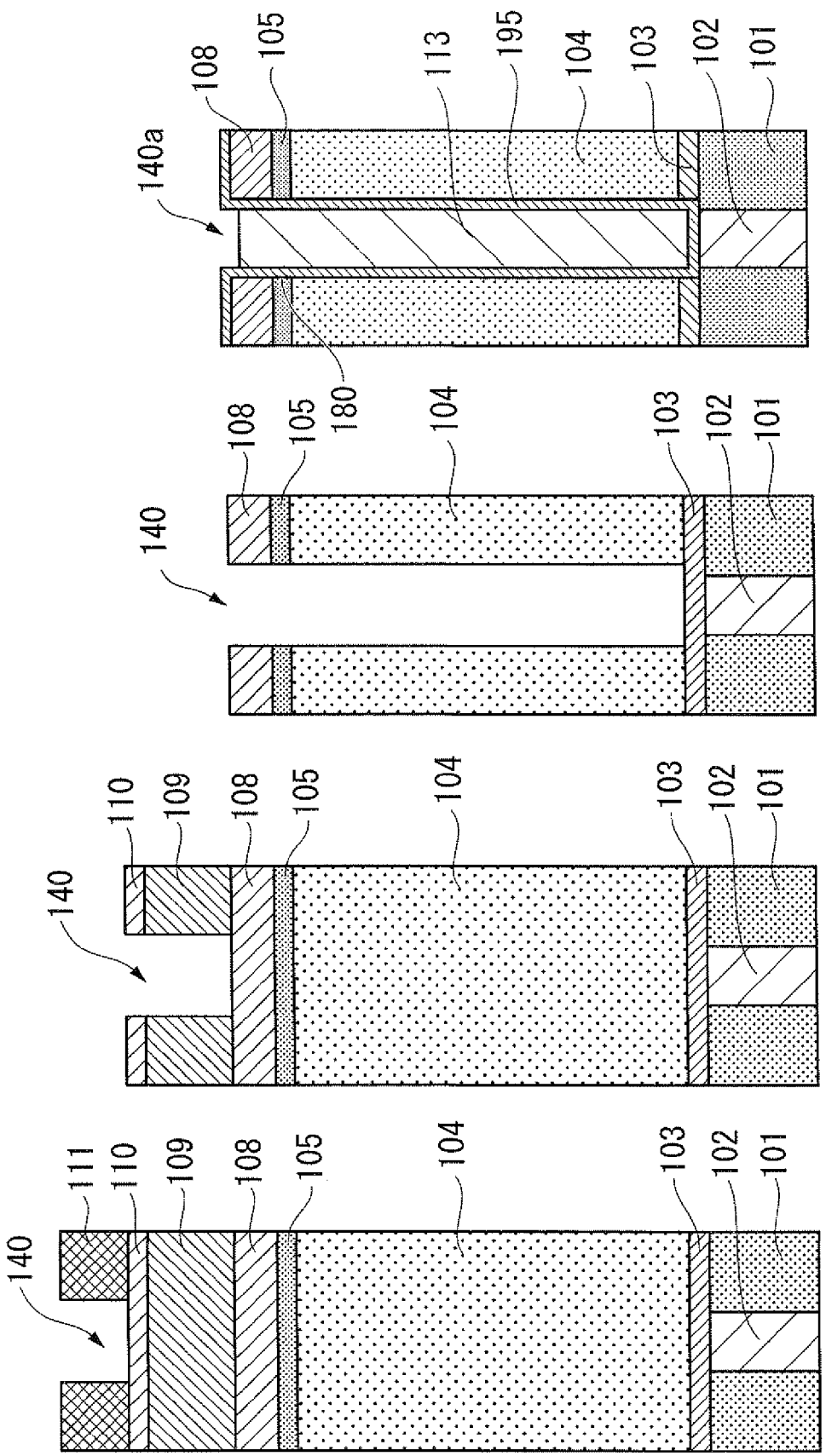

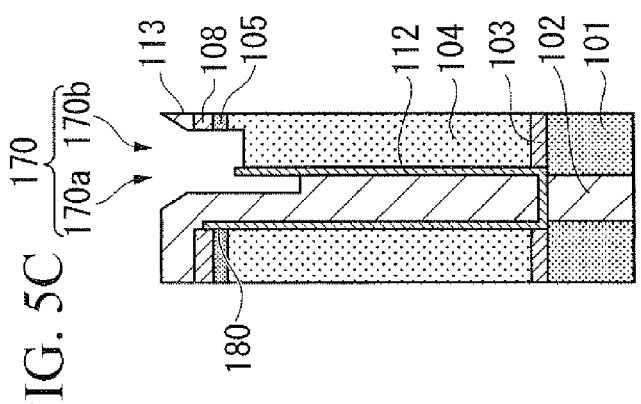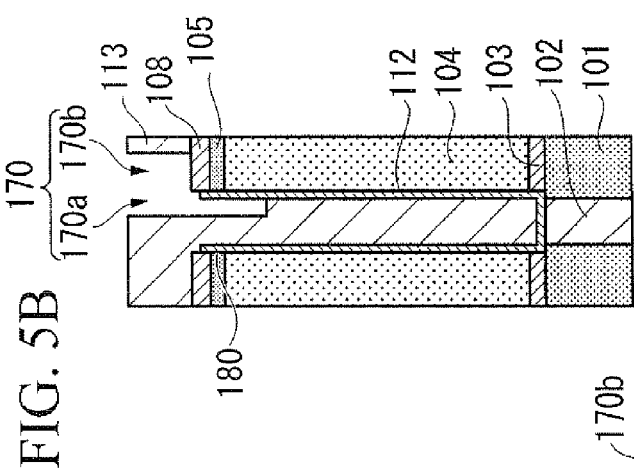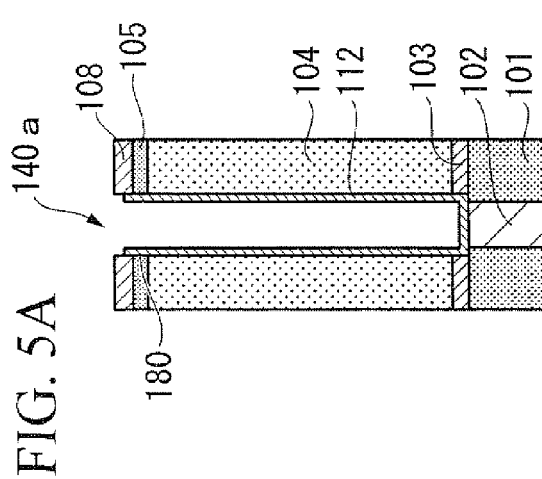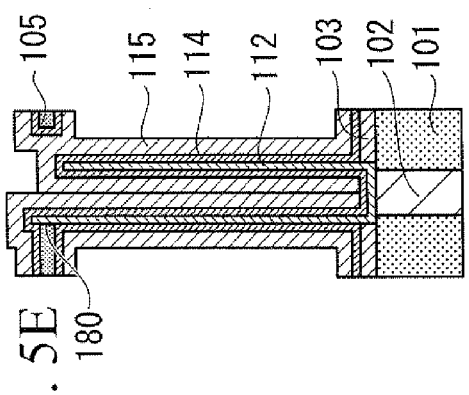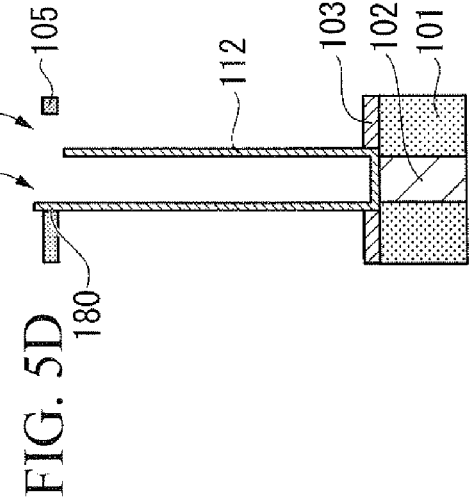

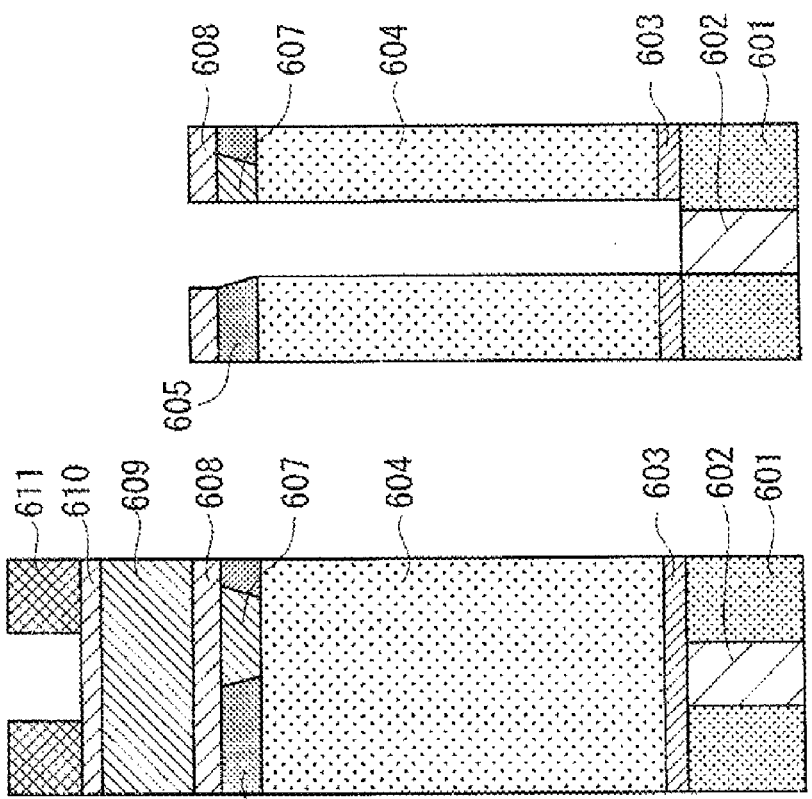
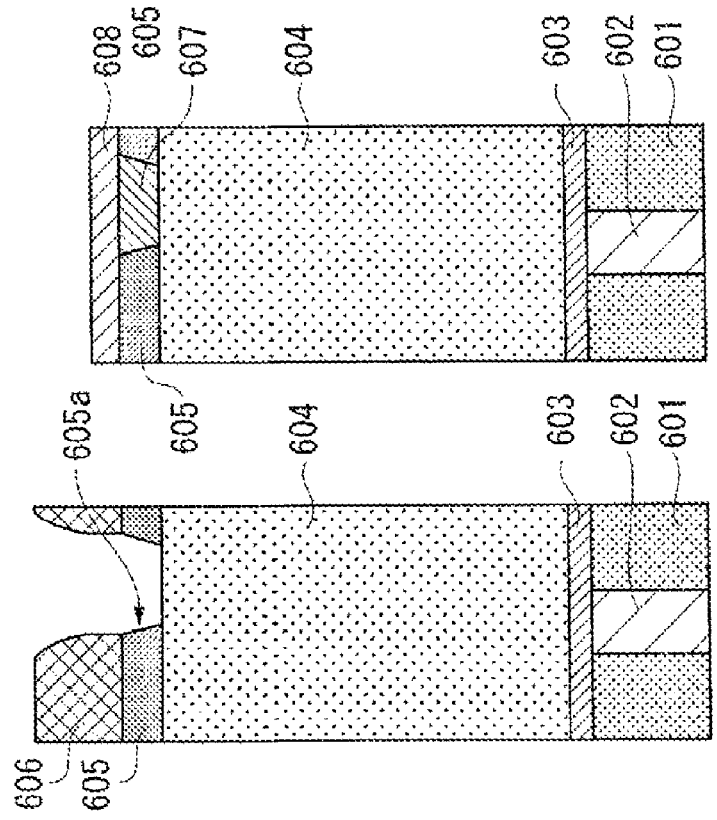
FIG. 17A Prior Art
FIG. 17B Prior Art
FIG. 17C Prior Art
FIG. 17D Prior Art

SEMICONDUCTOR DEVICE AND MANUFACTURING METHOD THEREFOR

BACKGROUND OF THE INVENTION

1. Field of the Invention

The present invention relates to a semiconductor device with a capacitor, particularly a semiconductor device with a cylindrical type of a capacitor, and a manufacturing method thereof.

Priority is claimed on Japanese Patent Application No. 2007-126538, filed on May 11, 2007, the content of which is incorporated herein by reference.

2. Description of Related Art

Generally, a cell of dynamic random access memory (hereinafter, referred to as DRAM) is composed of a transistor and a capacitor. The capacitor is composed of a lower electrode (first electrode), a dielectric film and an upper electrode (second electrode). As the size of the DRAM gets smaller, the space occupied by the cell also becomes smaller. In order to acquire a certain amount of capacitance in the limited occupied-space, it is required to make an electrode structure of the capacitor to be three-dimensional, thereby increasing a superficial area of the electrode. For these reasons, a constitution has started to be used wherein the lower electrode in the capacitor is constituted by aligning a plurality of columnar portions, and then the dielectric film and the upper electrode is formed by covering the columnar portions, thereby increasing the superficial area of the capacitor and increasing the capacitance of the capacitor.

Furthermore, a constitution has also started to be used wherein the dielectric film and the upper electrode are formed inside the columnar portions, by providing a pore portions inside the columnar portions, thereby increasing the capacitance of the capacitor.

FIGS. 11A and 11B are drawings which show an example of the lower electrode in the capacitor. FIG. 11A is a schematic planar view thereof, and FIG. 11B is a schematic cross-sectional view taken along the line B to B' in FIG. 11A.

As is clear from FIG. 11A, a lower electrode 512 is composed of the columnar portion 512a and the bottom portion 512b. Also, there is a plurality of the lower electrodes 512. Also, as is clear from FIG. 11B, the columnar portion 512a is in a tubular shape and contains the pore portion 540a inside.

When the aspect ratio of "the height in columnar direction" relative to "the diameter of the lower electrode 512" is enhanced, that is, when the diameter of the lower electrode 512 is reduced whereas the height in columnar direction is raised, a plurality of the columns can be formed in the occupied-space limited in the cell. Therefore, the superficial area of the capacitor can be increased, and the capacitance of the capacitor can also be increased.

Furthermore, the thinner the film thickness of materials which constitute the lower electrode 512 is, the wider a pore portion 540a is. Therefore, the superficial area of the capacitor can be increased, and the capacitance of the capacitor can also be increased.

As shown in FIG. 11B, a storage node contact plug (also sometimes referred to conductor plug) 502 is buried in an insulating film 501 composed of a SiO$_2$ film which is provided on the semiconductor substrate (the substrate is abbreviated in the figure). The lower electrode 512 is formed by contacting the storage node contact plug with the bottom portion 512b, and the insulating film 503 composed of a SiN film is formed around the contacted part.

FIGS. 12A to 12C are a process drawing which shows an example of manufacturing process of the lower electrode 512.

Firstly, as shown in FIG. 12A, a storage node contact plug 502 which is composed of a conductor is formed in an oxide film 501, then a nitride film 503 and an oxide film 504 is formed sequentially, a pore portion which is the basis of the lower electrode 512 is opened, and then the lower electrode 512 is formed. Subsequently, a photoresist 513 is applied, exposed, and then developed, thereby protecting only a necessary portion of the lower electrode 512.

Then, as shown in FIG. 12B, the lower electrode 512 is etched back by conducting dry-etching, and is separated from adjacent other lower electrodes 512 (they are abbreviated in the figure). Subsequently, the photoresist 513 is removed by conducting ashing or the like.

Furthermore, as shown in FIG. 12C, an oxide film 504 used as a mold of the lower electrode 512 in FIG. 12B is removed by hydrofluoric acid treatment, thereby forming the lower electrode 512.

FIG. 13 is a schematic cross-sectional view of a capacitor using the lower electrode 512. The capacitor is formed by forming a dielectric film 514 between the tubular-shaped lower electrodes 512, and further by forming an upper electrode 515.

As a result, the lower electrode 512 has a conduction only with the storage node contact plug 502 provided at the bottom side, and electric charge can be stored in the dielectric film 514 between the upper electrode 515 and the lower electrode 512.

However, in the case of forming a capacitor by using the above constitution and increasing the superficial area, there are problems that the columnar-shaped lower electrode 512 may lack physical stability because a high aspect ratio is needed, and thus the columnar lower electrode 512 may fall down in the middle of the manufacturing process.

Furthermore, in the case of increasing the superficial area by making the lower electrode 512 in a tubular shape, it is necessary to thin the film thickness of the tubular-shaped columnar portion 512a, therefore the columnar lower electrode 512 may lack physical stability, and may fall down in the middle of the manufacturing process.

FIGS. 14A and 14B are drawings which show that a part of the lower electrodes fall down, and is contacted with adjacent lower electrodes 512.

FIG. 14A is a schematic planar view thereof, and FIG. 14B is a schematic cross-sectional view taken along the line C to C' in FIG. 14A. Letters and numerals in FIGS. 14A and 14B are shown in the same way as in FIGS. 11A and 11B.

When a capacitor is formed in such a state, an electrical short circuit may be caused, therefore it is a big problem as a semiconductor device.

Some approaches have been suggested, taking the above circumstances into consideration. For example, in Japanese Unexamined Patent Application, First Publication, No. 2003-142605, there is disclosed a constitution in which a support called as "insulating beam" is formed between the lower electrodes, thereby preventing the lower electrode from falling down. Also, in Japanese Unexamined Patent Application, First Publication No. 2003-297952, there is disclosed a constitution in which a support called as "frame" is formed between the lower electrodes, thereby preventing the lower electrode from falling down. However, in methods described in the above references, straight-line insulating beams are provided in a horizontal or vertical direction, relative to the lower electrode aligned regularly in rows and columns. Alternatively, straight-line insulating beams are provided both in a horizontal direction and in a vertical direction, thereby preventing the lower electrode from falling down. Therefore, in a layout shown in FIGS. 11A and 11B in which the lower electrodes are aligned densely, it is required that the insulating beam with a narrower width than the width of the resolution limit of lithography should be formed in an oblique direction, so it is difficult to be achieved.

On the other hand, FIGS. 15A and 15B show a conventional example using an insulating beam with a width capable of being formed in lithography. FIGS. 15A and 15B are an example showing an example of a capacitor in which a beam 605 is formed. FIG. 15A is a schematic planar view thereof, and FIG. 15B is a schematic cross-sectional view taken along the line D to D' in FIG. 15A. In the capacitor, the constitution of the lower electrode 612 is the same as the constitution of the lower electrode 512 shown in FIGS. 11A, 11B, 12A and 12B, except that the beam 605 is formed in FIGS. 15A and 15B, but not formed in FIGS. 11A, 11B, 12A and 12B.

As is clear from FIG. 15A, the beam 605 is formed in a line, contacting the side surface of a plurality of the lower electrodes 612. In this case, the beam 605 is formed in a line with a large width which can be formed by lithography, therefore the difficulty to form the beam itself can be reduced.

Furthermore, as is clear from FIG. 15B, the beam 605 is formed between adjacent lower electrodes 612, whose upper side are contacted by the beam 605. Therefore, the capacitor can prevent the lower electrode 612 from falling down. Here, the beam 605 is formed by a SiN film.

However, even if the beam 605 is used, there are such problems that the beam 605 may be removed from the lower electrode 612, and may be bent, and further the lower electrode 612 may fall down due to a wet treatment (washing step) in the manufacturing process of a semiconductor device, or due to a surface tension taken in the drying step accompanied with the wet treatment.

FIGS. 16A and 16B are drawings showing that the lower electrode 612 in the capacitor shown in FIGS. 15A and 15B falls down, due to the washing step. FIG. 16A is a schematic plan view thereof, and FIG. 16B is a schematic cross-sectional view taken along the line E to E' in FIG. 16A. Letters and numerals of members shown in FIGS. 16A and 16B are the same as those in FIGS. 15A and 15B. It is found that three out of a plurality of the lower electrodes 612 are removed from the beam 605, and fall to adjacent lower electrodes 612

As a technique to avoid such a problem that the lower electrode is removed from the beam as described above, it is considered to increase the film thickness of the beam 605. The thicker the film thickness is, the larger the contacting portion can be, thereby strengthening the resistance against collapse of the lower electrode 612. Therefore, the inventors tried to form the beam 605 with a film thickness of about 100 nm to 150 nm.

FIGS. 17A to 17D and FIGS. 18A to 18D are process drawings, each of which shows an example of manufacturing steps to form a lower electrode 612, in which the film thickness of a beam 605 is thickened.

FIG. 17A is a cross-sectional view showing the portion where the lower electrode is formed in the etching process of the beam 605. The etching surface 605a of the insulating film 605 is formed with a slope in the direction of the film thickness.

The steps shown in FIGS. 17B to 17D and FIGS. 18A to 18B are conducted, using the beam 605. In the case of forming the lower electrode 612, a pore portion 640a of the lower electrode 612 is tapered at the portion where the beam 605 is formed, and it is formed with a narrower space at the region below the beam 605, as shown in FIG. 18C.

In this way, a pore portion 640a with a narrower space decreases the capacitance of the capacitor. Therefore, it becomes a factor causing the deterioration of the characteristics of the capacitor.

In the case of further increasing the film thickness of the beam 605, the pore diameter becomes smaller at the bottom part of the lower electrode 612, therefore sometimes the pore cannot be achieved.

Moreover, in the case that exposure output is increased in order to etch the beam 605 forcedly in a vertical form, a photoresist 606 used as a mask cannot endure the exposure output. As a result, a pore diameter is expanded, the adjacent lower electrodes 612 get close to each other, and thus the capacitor itself becomes a structure to have a tendency to short out.

Furthermore, in the case of increasing the film thickness of the beam 605, parasitic capacitance between the lower electrodes 612 of the capacitor is increased because a nitride film has a relative permittivity of about 7. As a result, there is a problem such that a high-speed operation of a semiconductor device is interrupted. Particularly, it becomes a big problem in manufacturing a device capable of carrying out a high-speed operation wherein a trace of 70 nm or less is used. From the above results, it is clarified that a required semiconductor device cannot be realized only by increasing the film thickness of the beam.

Taking the above into consideration, a semiconductor device and a manufacturing method thereof are desired, in which a beam 605 is not easily removed from a lower electrode 612, in spite of the fact that the film thickness of the beam 605 is as thin as possible in order to decrease parasitic capacitance between the lower electrodes 612 thereby enabling a semiconductor device to carry out high-speed operations.

SUMMARY OF THE INVENTION

The object of the present invention is to provide a highly-integrated semiconductor device containing a capacitor equipped with a plate-like support which can prevent a plurality of lower electrodes densely aligned on a memory array from falling down and which also can ensure high capacitance, and a manufacturing method thereof.

A semiconductor device according to the present invention includes a plurality of cylindrical lower electrodes (first electrodes) which are densely aligned on a memory array; a plate-like support which is contacted with and links to the side surface of the cylindrical lower electrodes to support the plurality of cylindrical lower electrodes; a pore portion provided in the plate-like support; a dielectric film which covers the cylindrical lower electrode and the plate-like support in which the pore portion is formed; and an upper electrode (second electrode) formed on the surface of the dielectric film, wherein the boundary length of the part on the side surface of the cylindrical lower electrode which is exposed on the pore portion is shorter than the boundary length of the part on the side surface of the cylindrical lower electrode which is not exposed on the pore portion.

Also, in a semiconductor device of the present invention, the pore portion is in a circular or ellipsoidal shape; a single pore portion is contacted with the side surfaces of at least two cylindrical electrodes, and a plurality of the pore portions are provided in the plate-like support; and total area of the pore portions provided in the plate-like support is smaller than that of the plate-like support after the pore portion is provided.

Also, in a semiconductor device of the present invention, the film thickness of the plate-like support is within a range from 20 nm to 60 nm.

According to a semiconductor device of the present invention, the cylindrical lower electrode is not separated from the plate-like support, because the plate-like support which links cylindrical lower electrodes contains the contacting portion whose length is half or more than half of the boundary length of the cylindrical lower electrode, and is contacted with the cylindrical lower electrode. Therefore, the cylindrical lower electrode can be prevented from falling down. Also, a plurality of the pore portions are formed in a circular or ellipsoidal shape in the planar view, and the total area of the plurality of the pore portions is smaller than the total area of the plate-like support after the pore portions are provided. Therefore the plate-like support can surely contain the contacting portion whose length is half or more than half of the boundary length of the cylindrical lower electrode. Furthermore, because the film thickness of the plate-like support is within a range from 20 to 60 nm, the cylindrical lower electrode with the bottom side can be surely formed.

A method of manufacturing a semiconductor device of the present invention includes the steps of (1) laminating a first nitride film, a first oxide film and a second nitride film sequentially on an oxide film on which a conductor plug (storage node contact plug) is exposed; (2) forming a plurality of pore portions in the second nitride film; (3) burying the pore portions to form a second oxide film on the entire surface; (4) penetrating the second oxide film, the second nitride film, the first oxide film, and the first nitride film to form a cylindrical through-hole for exposing the conductor plug so that a part of the cylindrical through-hole is overlapped with the pore portion; (5) forming a cylindrical lower electrode on the inner circumference of the through-hole to contact the lower electrode with the second nitride film exposed on the inner circumference of the through-hole; (6) removing the second oxide film and the first oxide film to expose the outer circumference of the lower electrode, and mutually linking the lower electrodes through the second nitride film in which the pore portion is formed; (7) laminating a dielectric film and an upper electrode sequentially to cover the lower electrode whose inner circumference and outer circumference are exposed, wherein, in the step of forming the through-hole, the through-hole is aligned so that the length of the part where the through-hole is overlapped with the pore portion is shorter than the length of the part where the through-hole is not overlapped with the pore portion in the planar view.

Also, in the method of manufacturing a semiconductor device of the present invention, the pore portion is in a circular or ellipsoidal shape, a plurality of the pore portions are provided in the second nitride film so that a single pore portion is contacted with the side surfaces of at least two cylindrical lower electrodes, and the total area of the part where pore portions are provided is smaller than the total area of the second nitride film where the pore portions are not provided.

Further, in the method of manufacturing a semiconductor device of the present invention, the film thickness of the second nitride film is within a range from 20 to 60 nm.

According to a method of manufacturing a semiconductor device of the present invention, in the formation of the through-hole which penetrates the second nitride film as the plate-like support, the through-hole is aligned so that the length of the part where the through-hole is overlapped with the pore portion is shorter than the length of the part where the through-hole is not overlapped with the pore portion in the planar view. Therefore, it can be ensured that the length of the contacting portion where the cylindrical lower electrode formed on the through-hole is contacted with the second nitride film is half or more than half of the circumference length of the cylindrical lower electrode, and the cylindrical lower electrode is not separated from the second nitride film which becomes the plate-like support. Thus, when the second oxide film and the first oxide film are removed, the cylindrical lower electrode can be completely prevented from falling down, and a reliable semiconductor device can be manufactured. Also, in the semiconductor device of the present invention, a plurality of the pore portions are formed in a circular or ellipsoidal shape in the plate-like support, and the total area of the pore portions is smaller than the total area of the plate-like support after the pore portions are provided. Therefore, the plate-like support can have the contacting portion whose length is half or more than half of the outer circumferential length of the cylindrical lower electrode, thereby enabling the mechanical supporting strength of the plate-like support to be improved. Furthermore, because the film thickness of the plate-like support is within a range from 20 to 60 nm, the cylindrical lower electrode with the bottom side can be certainly formed.

According to the present invention, there can be provided a high-integrated semiconductor device and a method of manufacturing thereof, wherein a plurality of the cylindrical lower electrodes aligned in a memory array can be prevented from falling down, and the capacitor is equipped with the plate-like support which can ensure a large amount of capacitance.

BRIEF DESCRIPTION OF THE DRAWINGS

FIGS. 1A to 1D are process drawings which show a manufacturing process of a semiconductor device, which is an embodiment of the present invention.

FIGS. 2A to 2E are process drawings which show a manufacturing process of a semiconductor device, which is an embodiment of the present invention.

FIGS. 4A to 4D are process drawings which show a manufacturing process of a semiconductor device, which is an embodiment of the present invention.

FIGS. 5A to 5E are process drawings which show a manufacturing process of a semiconductor device, which is an embodiment of the present invention.

FIG. 6A is a schematic planar view thereof, and each of FIGS. 6B and 6C is an enlarged cross-sectional view of the semiconductor device taken along the line A to A' in FIG. 6A.

FIG. 11A is a schematic planar view thereof, and FIG. 11B is a schematic cross-sectional view of the conventional lower electrode taken along with the line B to B' in FIG. 11A.

FIG. 14A is a schematic planar view thereof, and FIG. 14B is a schematic cross-sectional view of the conventional lower electrode taken along with line C to C' in FIG. 14A.

FIGS. 15A and 151B are drawings which show an example of a conventional lower electrode. FIG. 15A is a schematic planar view thereof.

FIG. 16A is a schematic planar view thereof, and FIG. 16B is a schematic cross-sectional view of the conventional lower electrode taken along the line E to E' in FIG. 16A.

FIGS. 17A to 17D are process drawings which show an example of manufacturing process of a conventional lower electrode.

DETAILED DESCRIPTION OF THE INVENTION

In the following, embodiments of the present invention will be described in more detail, taking DRAM as an example. However, the present invention is not limited by those.
Embodiment 1

Figure 6A:
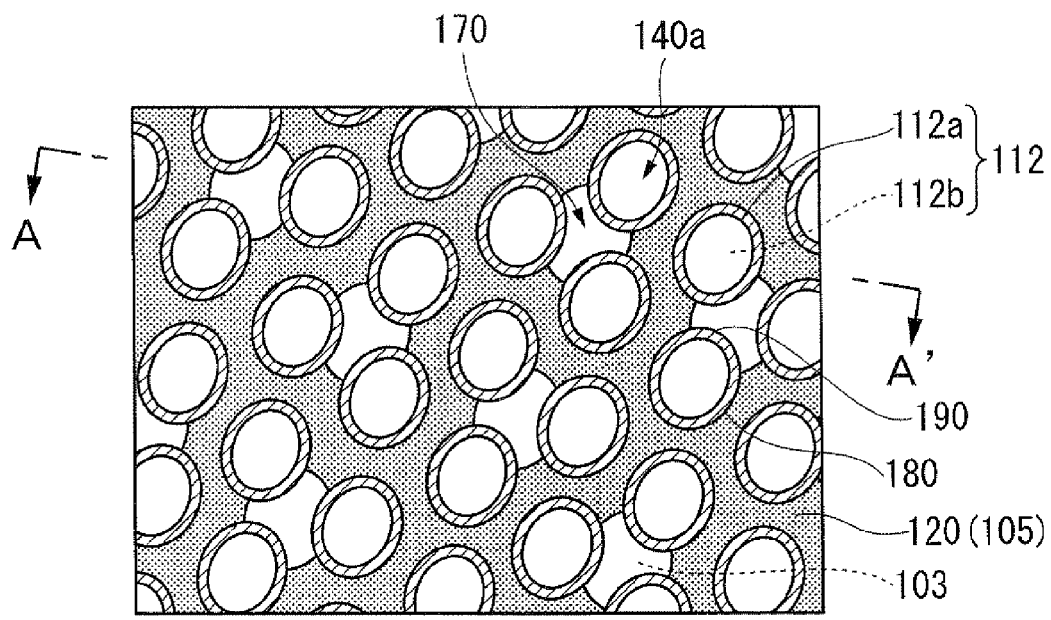
FIGS. 6A to 6C are explanatory drawings of a semiconductor device, which is an embodiment of the present invention.
Figure 6B:
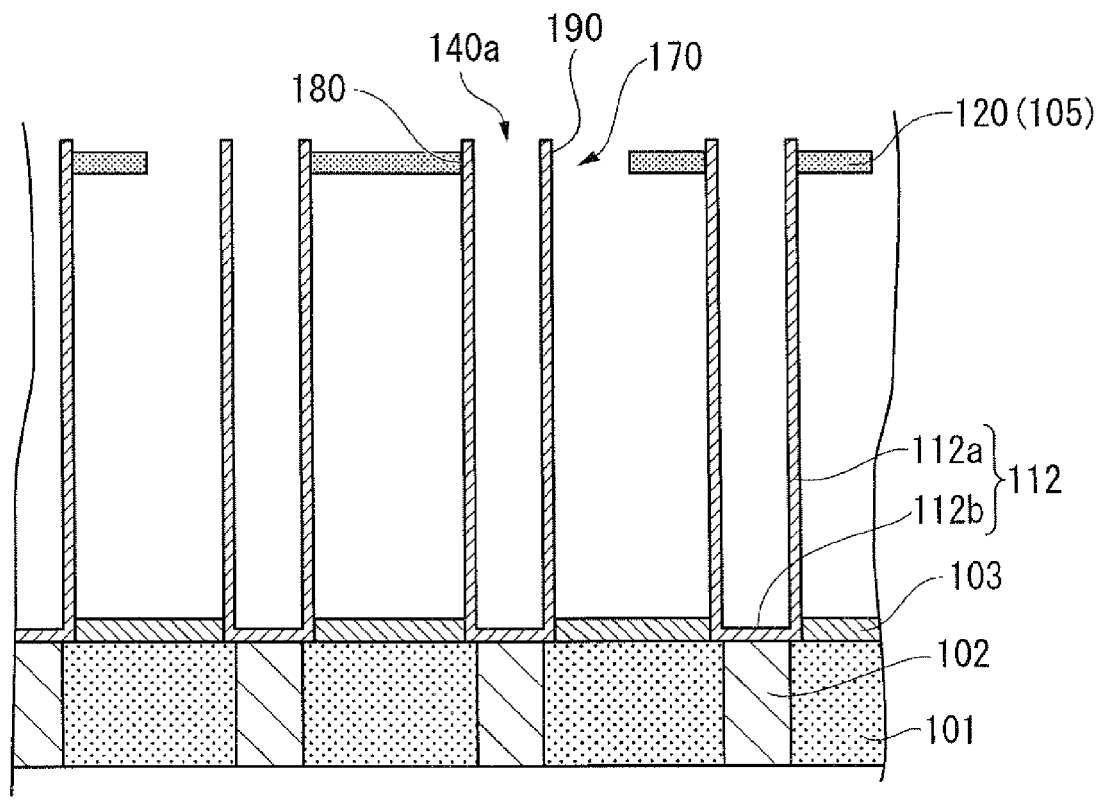
Figure 6C:
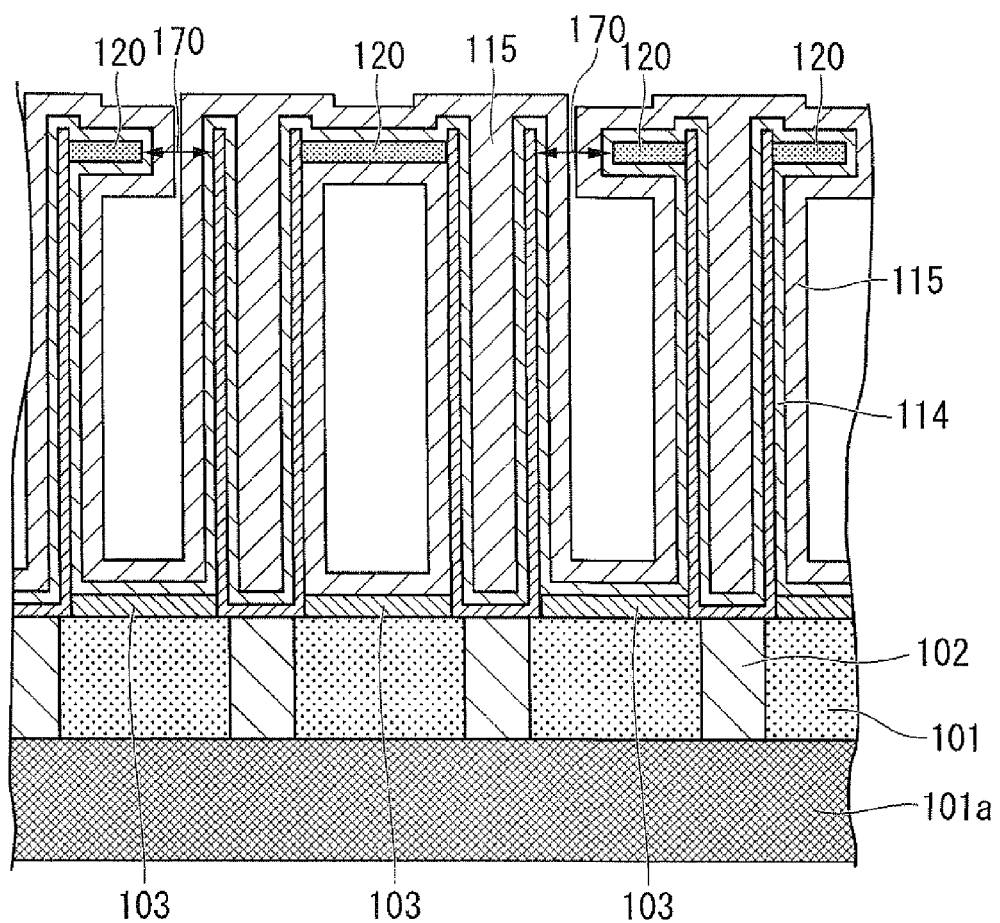

FIGS. 6A to 6C are drawings which show an example of a memory array of DRAM, which is an embodiment of the present invention. FIG. 6A is a schematic plan view of a lower electrode in a memory array region. FIGS. 6B and 6C are schematic cross-sectional views taken along the line A to A' in FIG. 6A.

As shown in FIG. 6A, the lower electrode 112 is in a circular shape in the planar view, and a plurality of lower electrodes are densely aligned in a memory array region. Here, the term "densely aligned" represents a condition in which the lower electrodes are aligned most efficiently and in the high density in order not to cause useless space in the planar space of a memory array. Therefore, the lower electrode is in a circular shape in the planar view, and even when any lower electrode is selected, six lower electrodes are aligned around the single lower electrode. Also, the distance between the center of each lower electrode is approximately equal mutually. Also, it is clear that the lower electrode 112 is in a cylindrical shape, with reference to the cross-sectional view shown in FIG. 6B.

The lower electrode 112 is composed of a cylindrical portion 112a and a bottom portion 112b. In the cylindrical portion 112a, a through-hole 140a is provided. Also, between the plurality of the cylindrical lower electrodes 112, a plate-like support 120 composed of a second nitride film 105 is formed. Also, in the plate-like support 120, a plurality of circular pore portions 170 are formed. The plurality of the cylindrical lower electrodes 112 are contacted with the plate-like support 120 through a contacting portion 180, and fixed. Therefore, the cylindrical lower electrode 112 cannot be separated from the plate-like support 120. Also, the total area of the plurality of pore portions 170 is smaller than the total area of the plate-like support in which the pore portions 170 are not formed. This enables the mechanical strength of the linking to be increased.

The pore portion 170 is opened in the plate-like support 120, with an approximately equal size as the outer diameter of the cylindrical lower electrode 112. Also, when three cylindrical lower electrodes 112 are put together as one unit, the pore portion 170 is positioned at the center of the unit. Through the pore portion 170, a first nitride film 103 formed on the bottom surface can be seen.

Also, as shown in FIG. 6B, the cylindrical lower electrode 112 is composed of a cylinder portion 112a and a bottom portion 112b. In the cylindrical portion 112a, a through-hole 140a is provided. The bottom portion 112b is contacted with a conductor plug as a storage node contact plug, thereby enabling an electrical connection to be obtained. Also, a first nitride film is formed around the bottom portion 112b. The first nitride film 103 is formed so that it covers a part of the lower outer circumference of the cylindrical lower electrode 112, and supports the cylindrical lower electrode 112 at the lower side. Further, the plate-like support 120 composed of the second nitride film 105 is formed in a horizontal direction. It links the plurality of the cylindrical lower electrodes 112 with one another through the contacting portion 180 provided on the upper side surface of the cylindrical lower electrode 112, and supports the lower electrode 112 at the upper side.

The pore portion 170 is provided in the plate-like support 120. By providing the pore portion 170, a part of the plate-like support 120 linked with the contacting portion 180 is removed, thereby forming a non-contacting portion 190.

In the cylindrical lower electrode 112, the length of the non-contacting portion 190 is shorter than that of the contacting portion 180. That is, a semiconductor device of the present embodiment includes a plurality of the cylindrical lower electrode 112 aligned densely in the memory array region; the plate-like support 120 which is contacted with the side surface 112a of the cylindrical lower electrode 112, and links to support the plurality of the cylindrical lower electrode 112; and the pore portion 170 provided in the plate-like support 120, wherein the boundary length of the part on the side surface 112a of the cylindrical lower electrode (the length of the non-contacting portion 190) which is exposed on the pore portion 170 is shorter than the boundary length of the part on the side surface of the cylindrical lower electrode (the length of the contacting portion 180) which is not exposed on the pore portion 170.

In the case that the length of the non-contacting portion 190 is longer than the length of the contacting portion 180, the cylindrical lower electrode 112 may be separated from the plate-like support 120, and thus may fall down to an adjacent cylindrical lower electrode 112, when a force caused by a certain factor is added. Examples of the certain factor include surface tension in the washing step.

Next, as shown in FIG. 6C, a dielectric film 114 is provided that covers the cylindrical lower electrode 112 and the plate-like support 120, and further the upper electrode 115 is provided on the dielectric film 114, thereby constituting a capacitor. That is, in a semiconductor device of the present embodiment, a memory array is constituted which contains a capacitor equipped with: a plurality of the cylindrical lower electrode 112 aligned densely in the memory array region on the semiconductor substrate 101a; the plate-like support 120 which is contacted with the side surface of the cylindrical lower electrode 112, and links to support the plurality of the cylindrical lower electrode; the pore portion 170 provided in the plate-like support; the dielectric film 114 which covers the plate-like support 120 in which the cylindrical lower electrode 112 and the pore portion 170 are formed; and the upper electrode 115 formed on the surface of the dielectric film. Here, the semiconductor substrate 101a includes a plurality of the active elements and passive elements such as a transistor and a wiring on the surface, and the conductor plug 102 is connected to a prescribed conductor layer of the semiconductor substrate 101a.

Here, in a semiconductor device of the present embodiment, the film thickness of the plate-like support 120 is preferably within a range from 20 to 60 nm. When the film thickness is within the range, the parasitic capacitance of the capacitor can be decreased, and also the semiconductor device can be operated at a high speed. Further, when the pore portion is formed, the operating efficiency can be improved. Furthermore, in the case of using such a thin film, the etching process can be performed easier, and it is possible to be etched in an approximately vertical shape.

In the case that the film thickness is less than 20 nm, the cylindrical lower electrode is more likely to fall down by a certain mechanical force, because the film thickness is too thin. On the other hand, in the case that the film thickness is more than 60 nm, it is difficult to control the etching process in the formation of the pore portion, thereby deteriorating the operation efficiency in the pore portion formation.

Also, when the aspect ratio which is regulated by the diameter and the height of the cylinder portion 112a in the lower electrode 112 becomes larger, that is, when the height of the cylinder portion 112a becomes higher whereas the diameter of the cylinder portion 112a becomes smaller, a large number of the cylindrical lower electrodes 112, whose height is high whereas whose diameter is small, can be aligned in the memory array region per area. Therefore, the constitution is advantageous for the high-integration of DRAM by increasing the number of the memory elements (capacitors). Further, the superficial area of each capacitor can be increased, and thus the capacitance can be also increased, thereby contributing to providing a reliable DRAM.

Furthermore, the beam can prevent the lower electrode from falling down, therefore the film thickness of the cylinder portion 112a in the lower electrode 112 can be thinner, and the inner superficial area of the through-hole 140a can be increased, thereby increasing the capacitance of the capacitor.

Embodiment 2

Next, another embodiment of a semiconductor device of the present invention will be described below.

A capacitor is formed in the same manner as the embodiment 1, except that a pore portion 171, which differs in the shape and the size from the pore portion 170b, is formed instead of the pore portion 170b described in the embodiment 1. Hereinafter, common members in the embodiments 1 and 2 will be described using the same numbers and letters.

Figure 7:
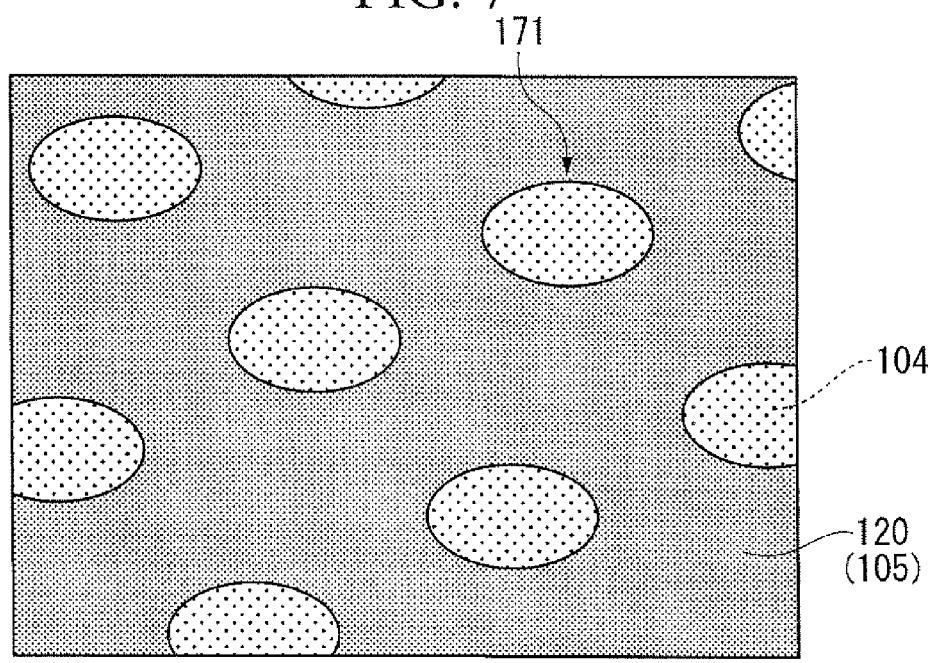
FIG. 7 is a schematic planar view which shows another example of a plate-like support, which is an embodiment of the present invention.

FIG. 7 shows a planar view wherein a plurality of ellipsoidal pore portions 171 are formed in the plate-like support 120. The total area of the plurality of pore portions 171 is shorter than the total area of the plate-like support 120 where the pore portions 171 are not formed. Through the pore portions 171, a first oxide film 104 formed at the lower layer can be seen.

Figure 8:
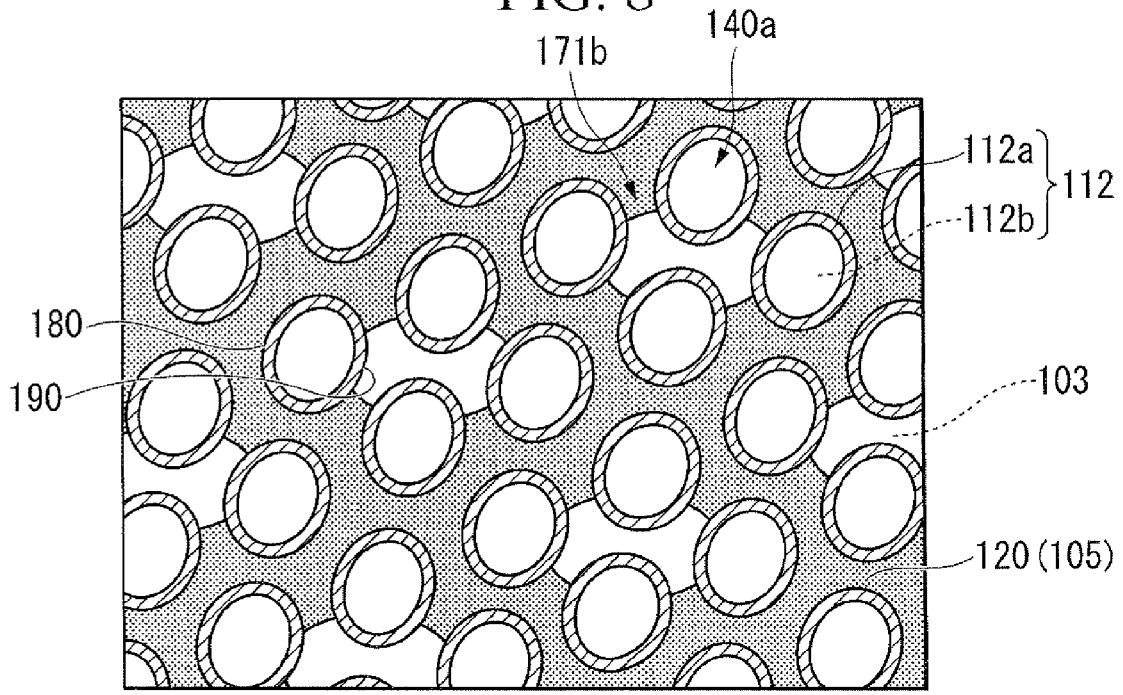
FIG. 8 is a schematic planar view which shows an example of a semiconductor device, which is an embodiment of the present invention.

FIG. 8 is a schematic planar view showing a plurality of cylindrical lower electrodes 112 formed in the plate-like support 120 in which an ellipsoidal pore portion 171b has been formed. The plate-like support 120 composed of a second nitride film 105 is formed through the cylindrical lower electrode 112 and a contacting portion 180. Here, the cylindrical lower electrode 112 is composed of a toroidal cylinder portion 112a and a bottom portion 112b. A first nitride film 103 formed at the lower layer can be seen from the ellipsoidal pore portion 171b.

When four cylindrical lower electrodes 112 are made one unit, the ellipsoidal pore portion 171b formed in the second nitride film 105 is positioned at the center of the unit. Also, the area of the ellipsoidal pore portion 171b is approximately twice as large as the area of the cylindrical lower electrode in the planar view.

Because the area of the ellipsoidal pore portion 171b is larger than the area of the pore portion 170b, the efficiency at the etching step, described in detail in the following embodiment of a method of manufacturing a semiconductor device, can be improved. That is, when an insulating film positioned at the lower layer of the plate-like support 120 is removed by using an etching treatment, the rate of removal by dissolution of the first oxide film by using an etching solution can be increased, thereby improving the operating efficiency. Also, simultaneously, the rate of forming a film of the dielectric film 114 and the upper electrode 115 can be increased, thereby improving operating efficiency.

Furthermore, the length of the contacting portion 180 between the plate-like support 120 and the cylindrical lower electrode 112 is longer than the length of the non-contacting portion 190. Therefore, the contact at the contacting portion 180 cannot be easily separated by a certain physical force, and cannot easily cause the cylindrical lower electrode 112 to fall down to an adjacent cylindrical lower electrode 112.

Embodiment 3

Next, another embodiment of a semiconductor device of the present invention will be described below.

A capacitor is formed in the same manner as in the embodiment 1, except that a pore portion 172, which differs in the shape and the size from the pore portion 170, is formed instead of the pore portion 170 described in the embodiment 1. Hereinafter, common members of the embodiments 1 and 3 will be described using the same numbers and letters.

Figure 9:
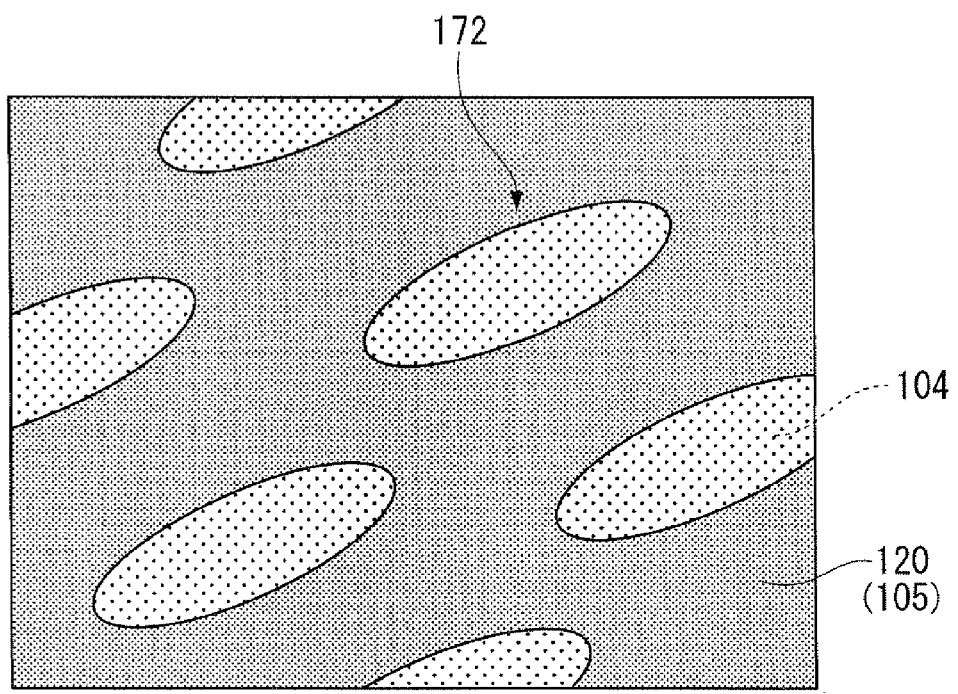
FIG. 9 is a schematic planar view which shows another example of a plate-like support, which is an embodiment of the present invention.

FIG. 9 shows a planar view in which a plurality of ellipsoidal pore portions are formed in a plate-like support 120. The ellipsoidal pore portion 172 of the embodiment 3 differs from the ellipsoidal pore portion 171 of the embodiment 2 in the point that the ellipsoidal pore portion 172 has a longer major axis than the ellipsoidal pore portion 171. The total area of the plurality of pore portions 172 is shorter than the total area of the plate-like support 120 where the pore portions 172 are not formed. Through the pore portions 172, a first oxide film 104 formed at the lower layer can be seen.

Figure 10:
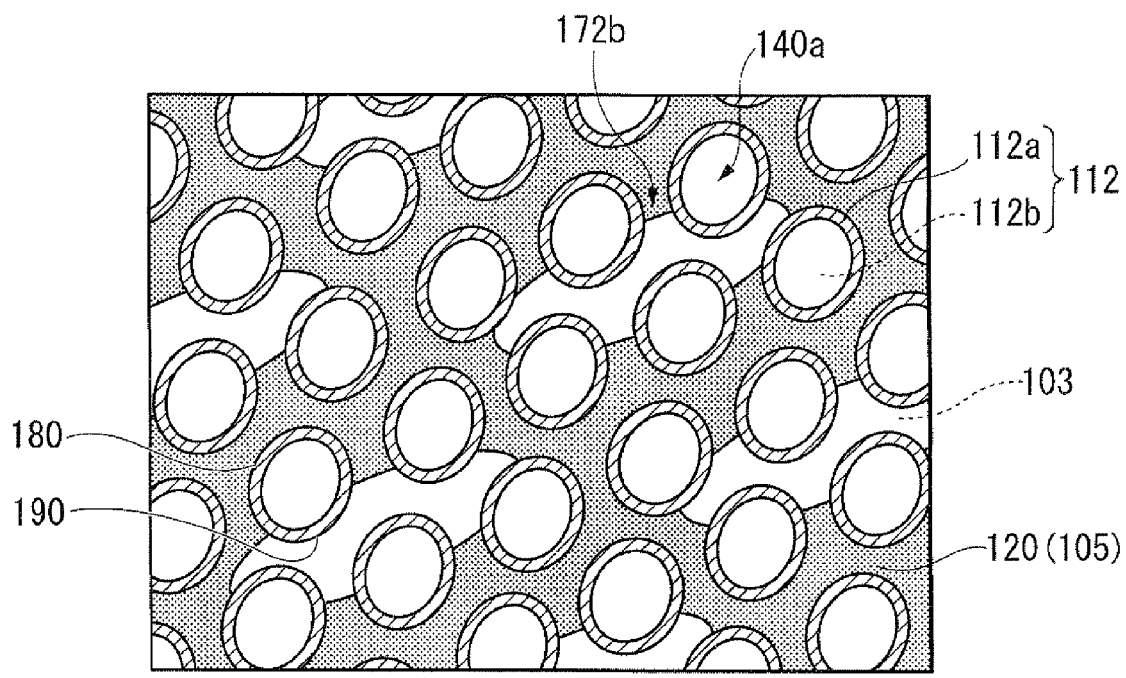
FIG. 10 is a schematic planar view which shows an example of a semiconductor device, which is an embodiment of the present invention.

FIG. 10 is a schematic planar view in which a plurality of cylindrical lower electrodes 112 are formed in a plate-like support. The plate-like support 120 composed of a second nitride film 105 is formed through the cylindrical lower electrode 112 and a contacting portion 180. Here, the cylindrical lower electrode 112 is composed of a toroidal cylinder portion 112a and a bottom portion 112b in the planar view. A first nitride film 103 formed at the lower layer can be seen from the ellipsoidal pore portion 172b.

When four cylindrical lower electrodes 112 are made one unit, the ellipsoidal pore portion 172b formed in the second nitride film 105 is positioned at the center of the unit. Also, the area of the ellipsoidal pore portion 172b is approximately three times as large as the cross-section area of the cylindrical lower electrode. Through the pore portion 170b, a first nitride film 103 formed on the bottom surface can be seen.

Because the area of the ellipsoidal pore portion 172b is larger than the area of the pore portion 170b, the rate of removal by dissolution of an insulating film positioned at the lower layer of the plate-like support 120 can be increased by using an etching solution, thereby improving the operating efficiency, as in the embodiment 2. Also, the rate of forming a film of the dielectric film 114 and the upper electrode 115 can simultaneously be increased, thereby improving the operating efficiency.

Furthermore, the length of the contacting portion 180 between the plate-like support 120 and the cylindrical lower electrode 112 is longer than the length of the non-contacting portion 190. Therefore, the contact at the contacting portion 180 cannot be easily separated by physical force, and cannot easily cause the cylindrical lower electrode 112 to fall down to an adjacent cylindrical lower electrode 112.

Here, the pore portions 170b, 171b and 172b are preferably in the circular or ellipsoidal shape in the planar view. It is also preferable that they can be formed by using a usual lithography, and the boundary length of the part on the side surface of the cylindrical lower electrode which is exposed on the pore portion is shorter than the boundary length of the part on the side surface of the cylindrical lower electrode which is not exposed on the pore portion.

Also, the lower electrode 112 is formed in a cylindrical shape with the bottom surface in the above embodiments, but may be formed in a columnar shape.

In a semiconductor device of the present invention, the lower electrode is in a cylindrical shape with the bottom side, and a plurality of the cylindrical lower electrodes are aligned, thereby constituting a memory array. Therefore, it is possible to have a large superficial area of the cylindrical lower electrode, and contain a capacitor with a high capacitance, which is advantageous for high integration.

Also, in a semiconductor device of the present invention, a plate-like support is provided in a memory array, and supports the upper side surface of the plurality of the cylindrical lower electrode. Here, the total area of a plurality of the pore portions provided in the plate-like support is smaller than the total area of the plate-like support without the plurality of the pore portions, therefore the plate-like support can be prevented from breaking down.

In a semiconductor device of the present invention, the non-contacting portion is formed on the upper side surface of the cylindrical lower electrode, accompanied with forming the pore portion in the plate-like support. Here, because the length of the non-contacting portion is shorter than the length of the contacting portion, the cylindrical lower electrode is not easily separated from the plate-like support, and can be prevented from falling down even if a certain factor is added in the manufacturing process such as a surface tension in the cleaning step.

In a semiconductor device of the present invention, the film thickness of the plate-like support is as thin as 20 nm to 60 nm, therefore the parasitic capacitance is not stored between the cylindrical lower electrodes, and the semiconductor device can be operated at high speed. In particular, in the case of using a semiconductor device wherein a wiring width of a minimal process size restricted in lithography is set to 70 nm or less, a semiconductor device of the present invention can be used particularly efficiently.

Embodiment 4

An embodiment of a method of manufacturing a semiconductor device of the present invention will be described below.

Figure 3:
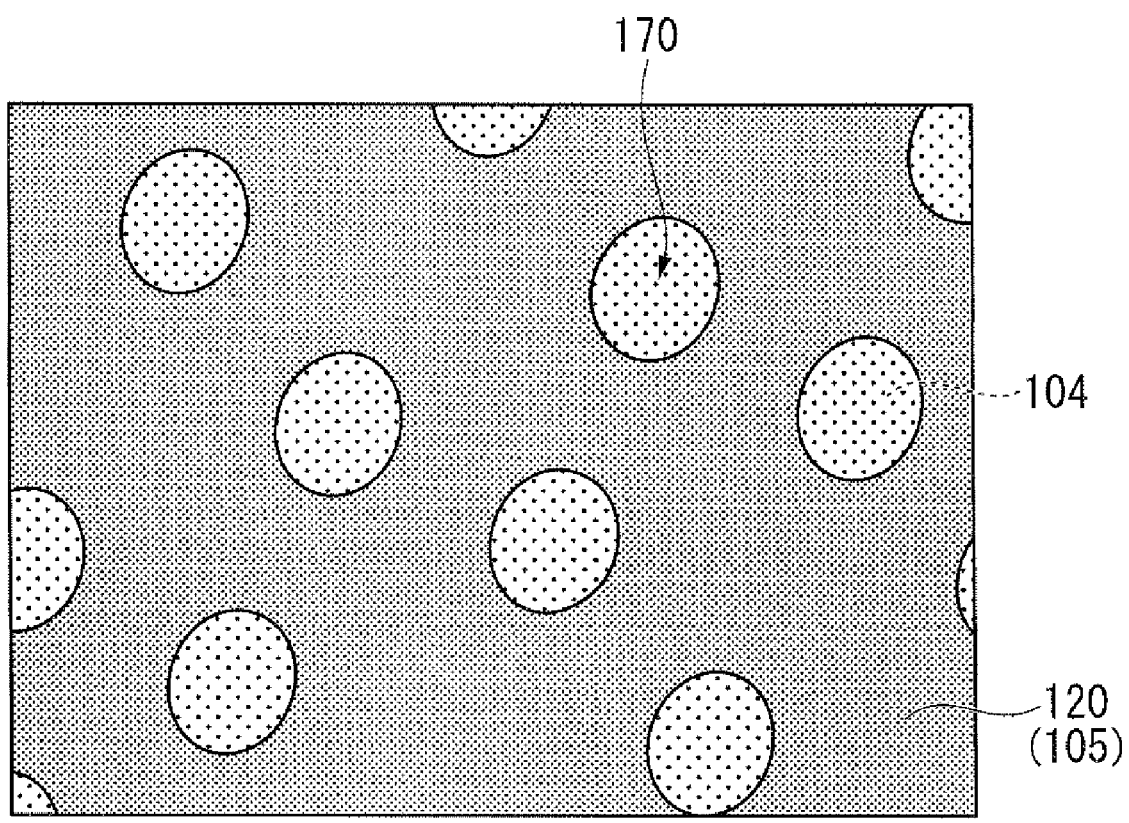
FIG. 3 is a schematic planar view showing a plate-like substrate, which is an embodiment of the present invention.

FIGS. 1A to 1D and FIGS. 2A to 2E are cross-sectional views showing a process of manufacturing a semiconductor device of the present embodiment, and showing a process of manufacturing a capacitor in the plurality of the cylindrical lower electrodes which constitute a memory array of the semiconductor device. Also, FIG. 3 is a schematic planar view at the time the manufacturing step shown in FIG. 1B is finished. Here, common members in the embodiments 1 and 4 will be described using the same numbers and letters.

Hereinafter, the manufacturing process will be described sequentially.

Step of Forming Pore Portion

Firstly, as shown in FIG. 1A, an oxide film 101 is formed on a semiconductor substrate (not shown in the figure) using a chemical vapor deposition method (hereinafter, referred to as CVD method, which contains LP-CVD method, PE-CVD method, and the like). Here, the semiconductor substrate is the same as the one used in the embodiment 1, which is shown in FIG. 6C. Subsequently, a conductor plug 102 is buried in the oxide film 101 using a conventional lithography technique, a dry-etching technique and a film-forming technique. The conductor plug 102 becomes a storage node contact plug of a cylindrical lower electrode, which will be formed at the following step. Then, a first nitride film 103 composed of a silicon nitride film with a film thickness of 50 nm, a first oxide film 104 composed of a silicon oxide film with a film thickness of 2,000 nm, and a second nitride film 105 composed of a silicon nitride film with a film thickness of 40 nm are formed sequentially, using a conventional CVD method. Subsequently, a photoresist 106 is applied. Further, a pore portion 170 is formed in the photoresist film 106 and the second nitride film 105, using a conventional lithography technique and a dry-etching technique, thereby enabling an etching solution and raw gases to inflow when a CVD film is formed.

Figure 11A:
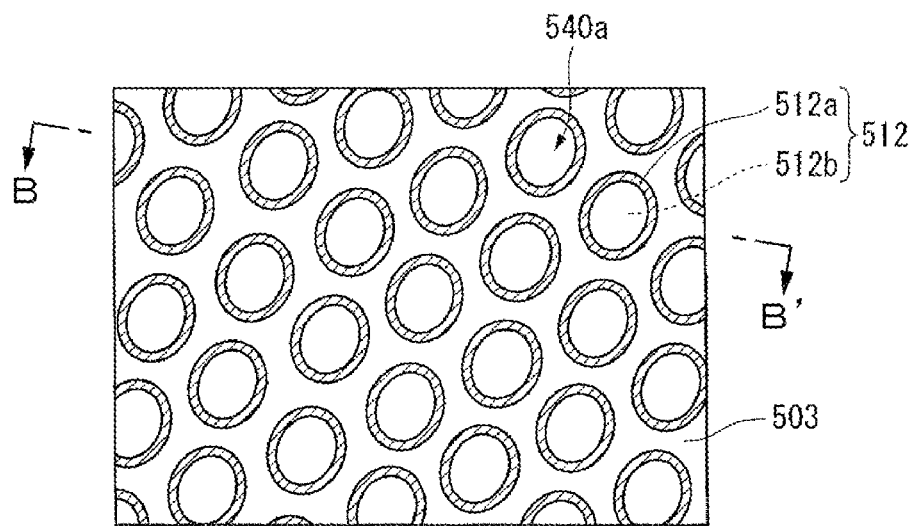
FIGS. 11A and 11B are drawings which show an example of a conventional lower electrode.
Figure 11B:
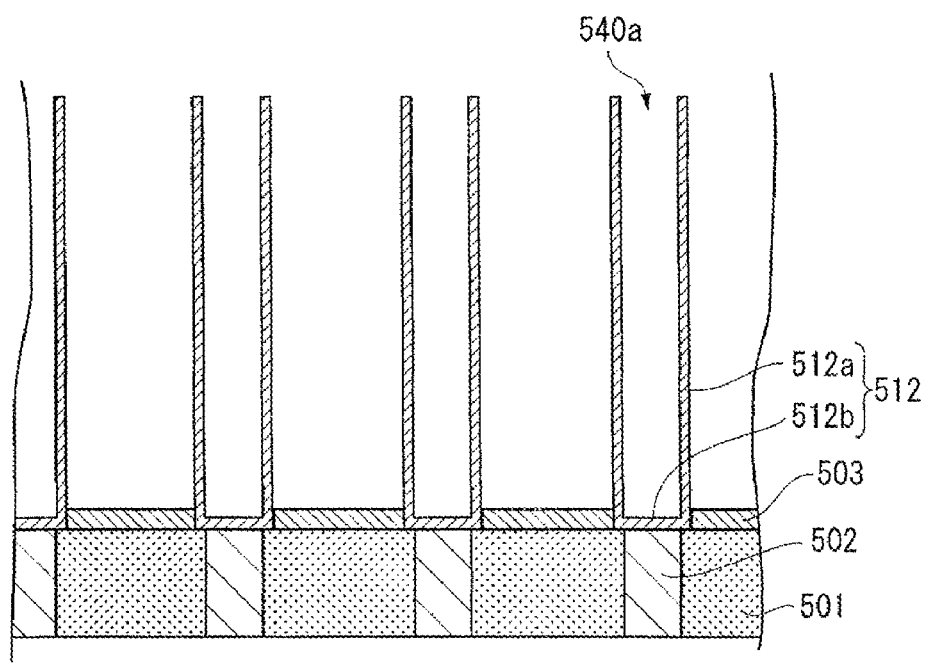
Figure 12A:
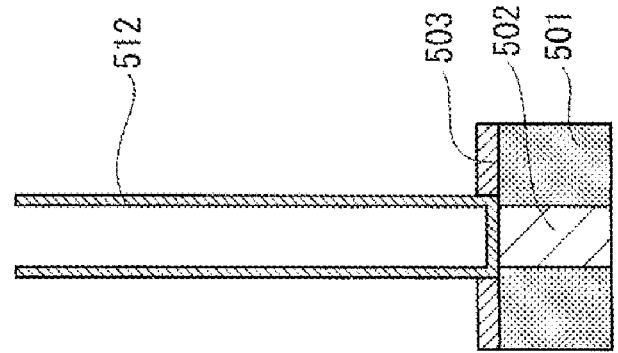
FIGS. 12A to 12C are process drawings which show an example of manufacturing process of a conventional lower electrode.
Figure 12B:
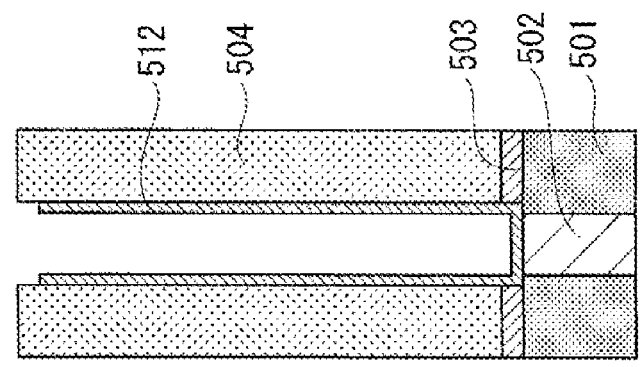
Figure 12C:
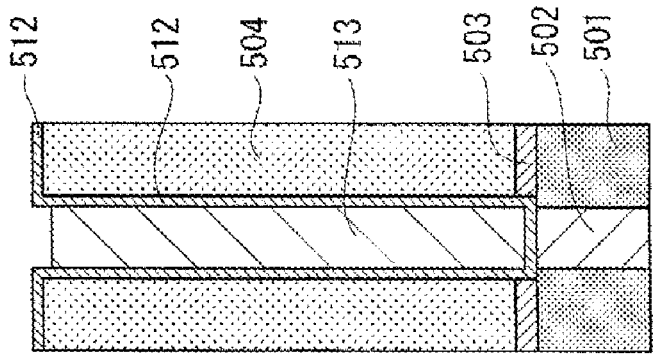
Figure 13:
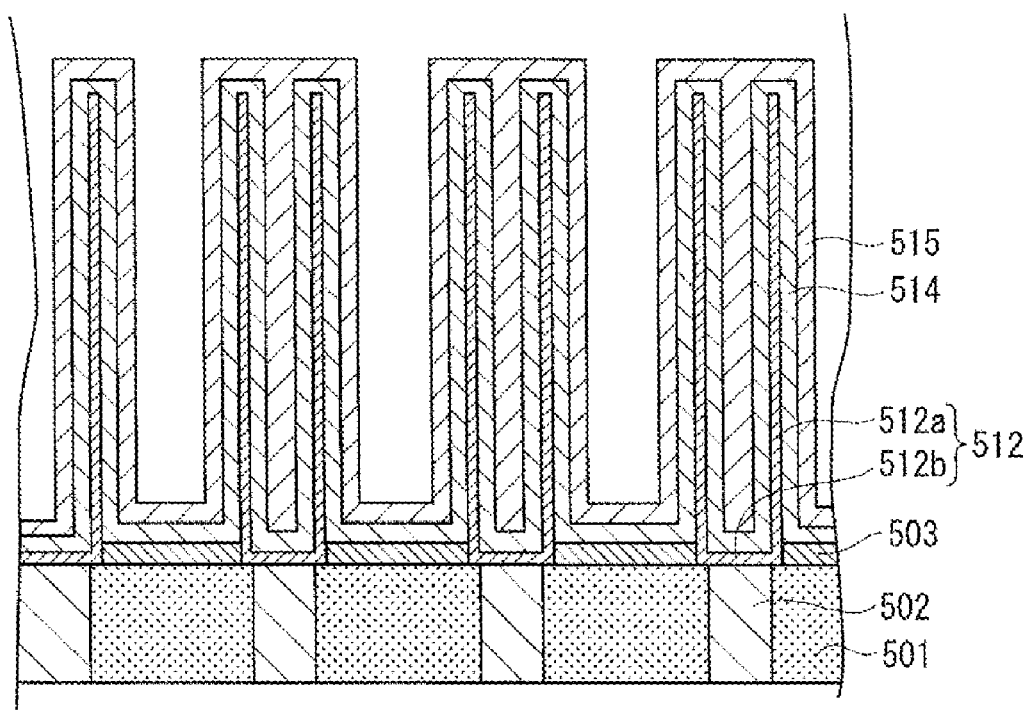
FIG. 13 is a schematic cross-sectional view which shows an example of a conventional capacitor.
Figure 14A:
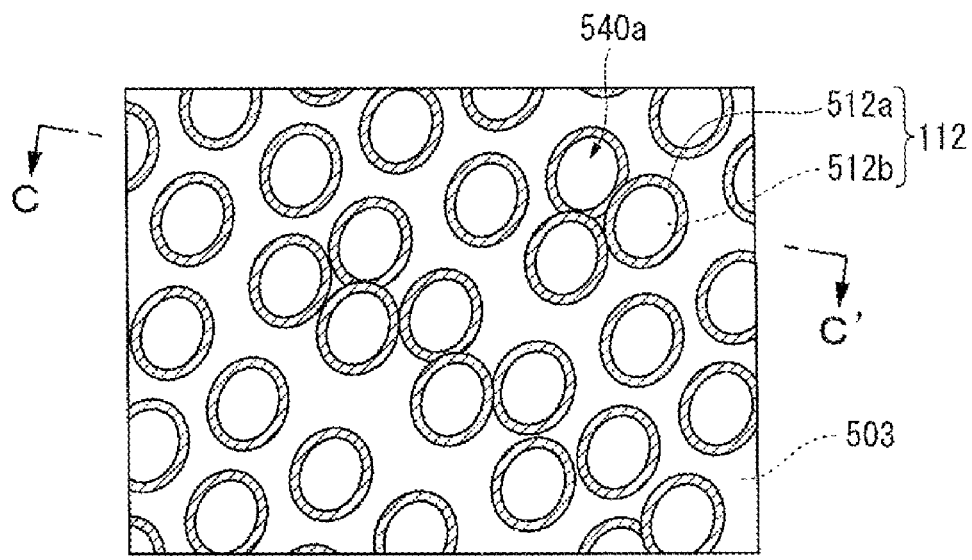
FIGS. 14A and 14B are drawings which show an example of a conventional lower electrode.
Figure 14B:
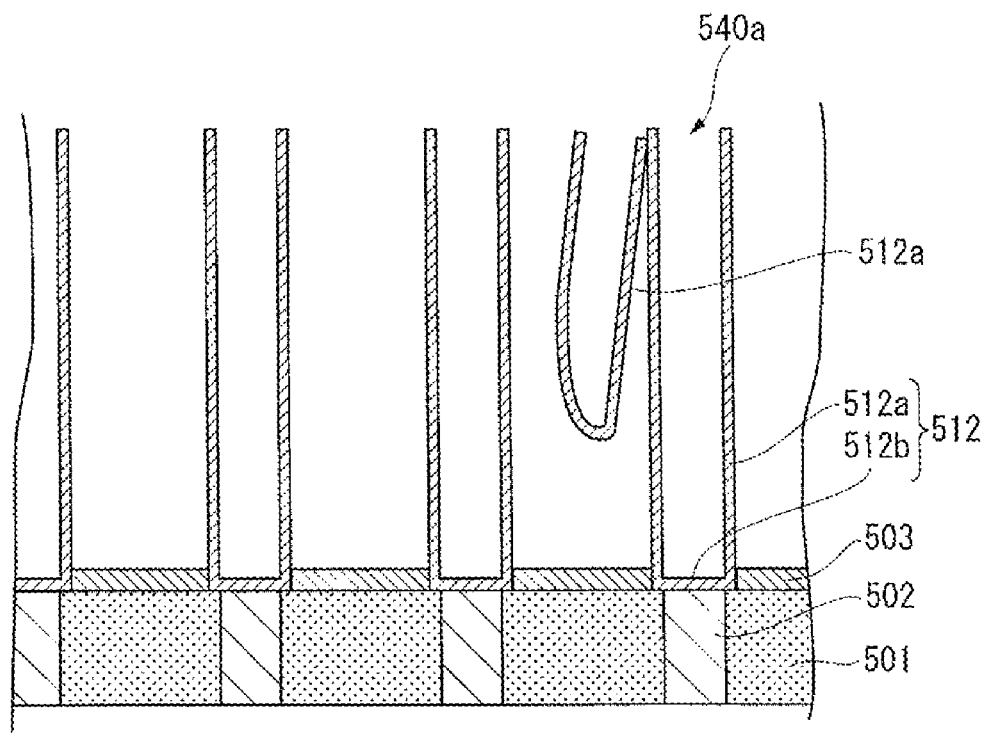
Figure 15A:
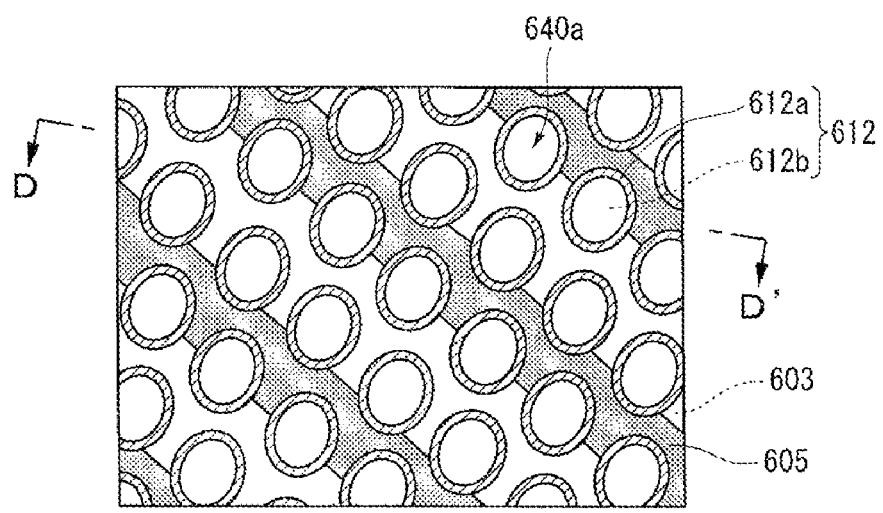
Figure 15B:
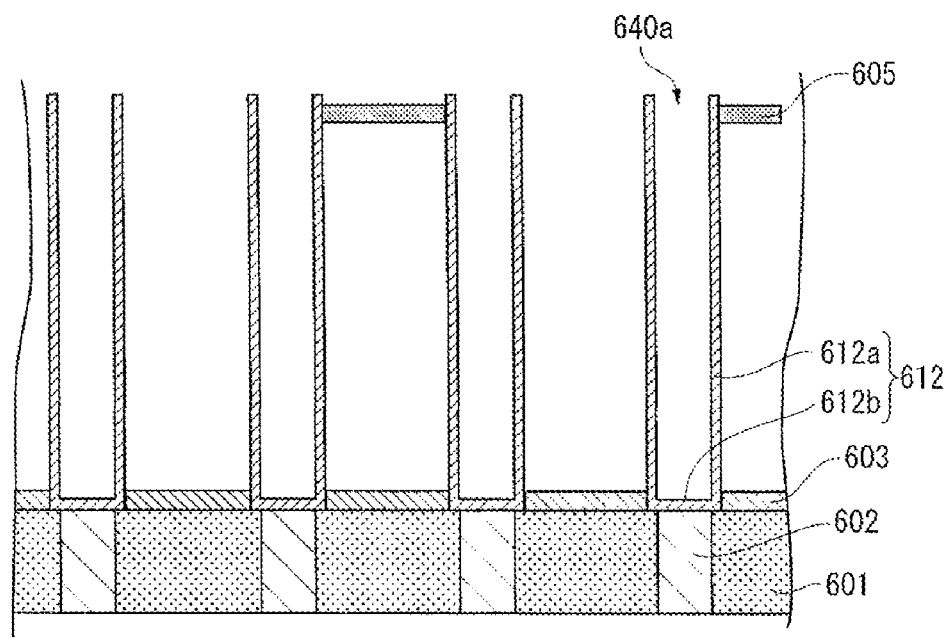
FIG. 15B is a schematic cross-sectional view of the conventional lower electrode taken along the line D to D' in FIG. 15A.
Figure 16A:
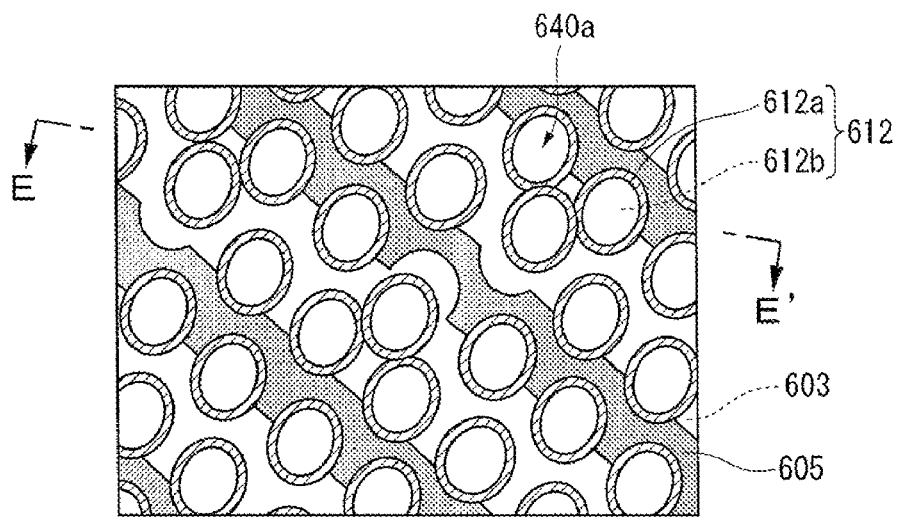
FIGS. 16A and 16B are drawings which show an example of a conventional lower electrode.
Figure 16B:
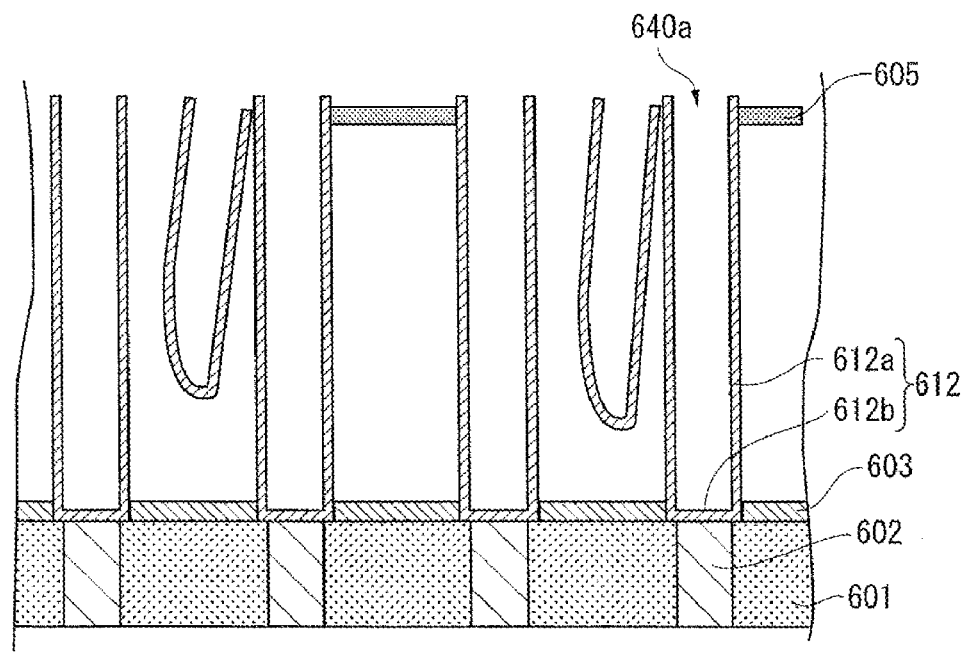
Figures 18A, 18B, 18C, 18D:
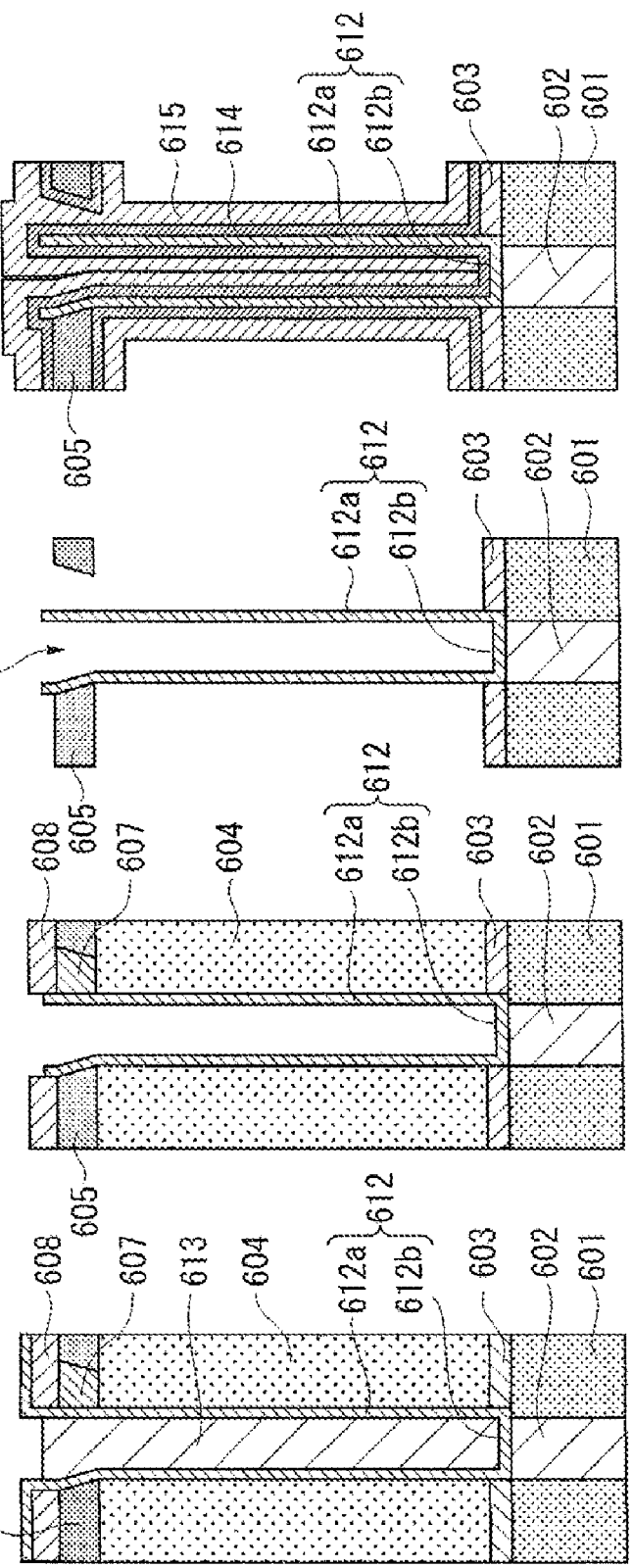
FIGS. 18A to 18D are process drawings which show an example of manufacturing process of a conventional lower electrode.

Subsequently, as shown in FIG. 11B, a plate-like support 120 composed of the second nitride film 105 is exposed on the surface by removing the photoresist 106. FIG. 3 is a planar view from overhead at the time the manufacturing step is finished. A plurality of circular pore portions 170 are dotted in the continuous single plate-like support 120. The total area of the plurality of pore portions 170 is smaller than the total area of the plate-like support 120 where the pore portions 170 are not formed. Here, the term "total area" represents an area in a memory array, the area of a surrounding circuit and the like in which pore portions are not formed is not considered. Also, the pore portion 170 is formed at the position where the pore portion 170 is partially overlapped with the through-holes for the plurality of the cylindrical lower electrodes formed at the following step, using a photomask in which a pattern has been formed. Through the pore portions 170, a first oxide film 104 filled at the lower layer can be seen. Here, a pore portion is in a circular shape in the planar view in the present embodiment, but it may be in an ellipsoidal shape.

Step of Forming Oxide Film

Subsequently, as shown in FIG. 1C, a second oxide film 108 composed of a silicon oxide film is formed entirely to bury the pore portion 170, using a conventional film-forming method such as a CVD method. On this occasion, the second oxide film 108 is also formed on the upper surface of the second nitride film 105. Here, the second oxide film 108 is formed entirely to vary the pore portion 107 in the present embodiment. However, after the second oxide film 108 is formed, the second oxide film 108 is embedded only in the pore portion 170 using a CMP method, followed by flattening the entire surface, and then another oxide film may be formed again on the pore portion 170 and the second nitride film 105. This enables the accuracy of the following lithography being improved because the flatness of the surface is improved, although the number of the steps is increased.

Step of Forming Through-Hole

Subsequently, as shown in FIG. 1D, a carbon film 109 is formed on the upper surface of the second oxide film. Further, after an intermediate mask layer 110 is formed and a photoresist film 111 is applied, a pattern of a though-hole 140 for forming the lower electrode is formed in the photoresist film 111, using a conventional lithography technique. The pattern of the through-hole 140 is formed by using a photomask having a pattern at a position where the pattern is partially overlapped with the pore portions 170 which has been formed. Also, the pattern of the through-hole 140 is formed so that the boundary length of the part on the circumference of the through-hole which is overlapped with the pore portion is shorter than the boundary length of the part on the circumference of the through-hole which is not overlapped with the pore portion.

Next, as shown in FIG. 2A, the intermediate mask layer 110 is etched using the photoresist film 111 as a mask, by a conventional dry-etching technique. The photoresist film 111 is removed, and then the carbon film 109 is etched using the etched intermediate mask layer 110 as a mask. Further, the second oxide film 108, the second nitride film 105, the first oxide film 104 and the first nitride 103 are sequentially etched using the etched carbon mask 109 as a mask, thereby forming the through-hole 140 which reaches the conductor plug 102. At the stage when the through-hole 140 is formed, the intermediate mask layer 110 is also etched and removed. Subsequently, the carbon film 109 is also removed by an etching treatment using an oxygen plasma. As a result, the second oxide film 108 is exposed on the surface.

In the present embodiment, because the film thickness of the second nitride film 105 is as thin as 40 nm, etching can be easily performed, and the second nitride film 105 can be etched in a approximately vertical shape Here, the first oxide film 104 is formed in a condition of having a taper slightly. In the present invention, the taper is generated at a degree where no problem is caused. If necessary, the etching rate can be controlled by means of changing the composition of the first oxide film 104 in a depth direction by introducing an impurity into the first oxide film 104, thereby enabling the first oxide film 104 to be etched in a vertical shape.

Step of Forming Lower Electrode

Subsequently, as shown in FIG. 2B, a conductor 195 composed of a high-conductive metal or alloy is formed on the entire surface with such a thickness that the through-hole 140 is not varied. Specifically, after forming a Ti film with a film thickness of 10 nm on the inner circumference of the through-hole 140 and on the surface of the second oxide film 108, using a CVD method or atomic layer deposition method (hereinafter, referred to as ALD method), a titanium nitride (hereinafter, referred to as TiN) is formed with a film thickness of 10 nm, thereby forming a alloy thin film 195 composed of Ti/TiN with the total film thickness of 20 nm.

The alloy thin film 195 is contacted with the second nitride film 105 exposed on the through-hole 140 through a contacting portion 180. Also, the pore size of the through-hole is smaller for the film thickness of the alloy thin film 195. Hereinafter, the size-reduced pore is referred to as "through-hole 140a.

Subsequently, a photoresist 113 is applied entirely, and then an exposure treatment followed by a developing treatment is conducted so that only the photoresist 113 filled inside the through-hole 140a remains. Consequently, the alloy thin film 195 formed on the second oxide film 108 is exposed. The photoresist 113 has a role in protecting the alloy thin film 195 in the through-hole 140a, when the alloy thin film 195 exposed on the surface is removed at the following etching treatment.

Next, as shown in FIG. 2C, the entire surface is etched back using a dry-etching method, thereby removing the alloy thin film 195 formed on the upper surface of the second oxide film 108. Subsequently, the photoresist 113 filled in the through-hole 140a is removed by conducting ashing or the like. As a result, a cylindrical lower electrode 112 composed of the alloy thin film 195 is formed on the inner circumference and the bottom surface of the through-hole. Here, it is preferable that the overetching condition in the entire etch back is controlled so that the top edge of the lower electrode 112 is positioned at the side wall of the second oxide film 108.

Step of Removing Oxide Film

Next, as shown in FIG. 2D, the semiconductor substrate is immersed in an etching solution such as an aqueous fluorinated acid solution, thereby removing the second oxide film 108 and the first oxide film 104. The etching solution removes by dissolution the surface of the second oxide film 108, and further the second oxide film 108 filled in the pore portion 170. This exposes the pore in which the cylindrical lower electrode 112 and the non-contacting portion 190 is formed on the surface. Hereinafter, the pore is referred to as "pore portion 170b". The etching solution inflows from the pore portion 170b, thereby removing by dissolution the first oxide film 104 filled inside. Here, the etching solution inflows into a region which is surrounded with the second nitride film 105, the first nitride film 103 and the cylindrical lower electrode 112, therefore the oxide film 101 provided on the semiconductor substrate is not removed by dissolution. As a result, a plate-like support 120 which contains a plurality of the pore portions 170b and links a plurality of the cylindrical lower electrode 112 is formed.

In the step of forming the through-hole 140 on which the cylindrical lower electrode 112 is formed, the through-hole 170 is aligned so that the boundary length of the part on the circumference of the through-hole 140 where the through-hole 140 is partially overlapped with the pore portion 170 is shorter than the boundary length of the part on the circumference of the through-hole 140 where the through-hole 140 is not overlapped with the pore portion 170 in a planar view. Therefore, the cylindrical lower electrode 112 is not separated from the plate-like support 120, and does not fall down.

Step of Forming Dielectric Film and Upper Electrode

Next, as shown in FIG. 2E, a dielectric film 114 is laminated on the surface of the cylindrical lower electrode 112, the first nitride film 103 and the plate-like support 120, and then an upper electrode 115 is laminated on the surface of the dielectric film 114, thereby forming a capacitor. The capacitor can store the charge in the dielectric film 114 which is between the upper electrode 115 and the lower electrode 112. Here, the dielectric film 114 and the upper electrode 115 are formed using a CVD method or an ALD method. Because raw gases can inflow through the pore portion 170, the raw gases also intrudes the outer circumference of the lower electrode, thereby enabling a film with a desirable film thickness to be formed.

Embodiment 5

Next, another embodiment of a method of manufacturing a semiconductor device of the present invention will be described below.

FIGS. 4A to 4D and FIGS. 5A to 5F are cross-sectional views showing another example of a method of manufacturing a semiconductor device, and are cross-sectional views showing a process manufacturing a capacitor in a memory array of the semiconductor device. Here, a capacitor is formed in the same manner as the embodiment 4, except that the step of forming a pore portion is moved from the first step to the later step.

Hereinafter, the manufacturing process will be described sequentially. Also, common members in the embodiments 4 and 5 will be described using the same numbers and letters.

Step of Forming Oxide Film

Firstly, as shown in FIG. 4A, an oxide film 101 is formed on a semiconductor substrate (not shown in the figure) using a chemical vapor deposition method. Here, the semiconductor substrate is the same as the one used in the embodiment 1, which is shown in FIG. 6C. Subsequently, a conductor plug 102 composed of a conductor such as a high conductive metal or alloy is buried in the oxide film 101 using a conventional lithography technique, a dry-etching technique and a film-forming technique. The conductor plug becomes a storage node contact plug. Further, a first nitride film 103, a first oxide film 104 and a second nitride film 105 is formed sequentially using a conventional film-forming method such as a CVD method.

Then, a second oxide film 108 is formed on the second nitride film 105 using a conventional film-forming method such as a CVD method. Subsequently, a carbon film 109 is formed on the upper surface of the second oxide film 108 using a conventional film-forming method such as a CVD method. Further, after an intermediate mask layer 110 is formed, a photoresist 111 is applied, and then a pattern of a though-hole 140 for forming the lower electrode is formed in the photoresist 111, using a conventional lithography technique.

Step of Forming Through-Hole

Next, as shown in FIG. 4A, the intermediate mask layer 110 is etched using the photoresist 111 as a mask, by a conventional dry-etching technique. Further, the carbon film 109 is etched using the etched intermediate mask layer 110 as a mask. When the carbon film 109 is etched, the photoresist 111 composed of mainly carbon is simultaneously removed.

Subsequently, as shown in FIG. 4C, the second oxide film 108, the second nitride film 105 and the first oxide film 104 are etched sequentially using the carbon film as a mask, thereby forming a through-hole 140. When the second oxide film 108 is etched, the intermediate mask layer 110 is also simultaneously removed. Then, the carbon film 109 is removed.

Step of Forming Lower Electrode

Next, as shown in FIG. 4D, the first nitride film 103 exposed on the bottom portion of the through-hole 140 is etched, thereby exposing a conductor plug 102. Here, the etching treatment of the first nitride film 103 may be performed sequentially after the first oxide film 104 is etched, and before the carbon film 109 is removed. Subsequently, a conductor 195 composed of a high conductive metal or alloy is formed. Specifically, after forming a film of Ti with a film thickness of 10 nm on the inner circumference of the through-hole and on the surface of the second oxide film 108 using a CVD method, an ALD method or the like, then a film of TiN is formed with a film thickness of 10 nm, thereby forming an alloy thin film 195 composed of two-layered structure of Ti/TiN with a total film thickness of 20 nm.

The alloy thin film 195 is contacted with the second nitride film 105 exposed on the through-hole 140 through a contacting portion 180. Also, the pore size of the through-hole 140 is smaller for the film thickness of the alloy thin film 195. Hereinafter, the size-reduced pore is referred to as "through-hole 140a".

Subsequently, a photoresist 113 is applied entirely, and then an exposure treatment followed by a developing treatment is conducted so that only the photoresist 113 filled inside the through-hole 140a remains. The photoresist 113 has a role in protecting the alloy thin film 195 in the through-hole 140a, when the alloy thin film 195 exposed on the surface is removed at the following etching treatment.

Next, as shown in FIG. 5A, a dry-etching treatment is conducted, thereby removing the alloy thin film 195 formed on the upper surface of the second oxide film 108. Subsequently, the photoresist 113 filled in the through-hole 140a is removed by conducting ashing, thereby forming a cylindrical lower electrode 112 composed of the alloy thin film 195 on the inner circumference of the through-hole 140 and on the bottom surface.

Step of Forming Pore Portion

Subsequently, as shown in FIG. 5B, the photoresist 113 is applied on the surface of the substrate. Then, a pattern of the pore portion 170 is formed in the photoresist 113 using a photomask in which a plurality of the pore portions are formed, by a conventional lithography technique. The plurality of the pore portions 170 are formed using a photomask in which a pattern is formed at a position where the pore portions 170 are partially overlapped with the cylindrical lower electrodes 112. Also, the pore portion 170 formed in the photoresist 113 becomes a pore portion 170a with a long depth at the part where the pore portion is overlapped with the cylindrical lower electrode 112, whereas it becomes a pore portion 170b with a short depth at the part where the pore portion is not overlapped with the cylindrical lower electrode 112. The second oxide film 108 is exposed at the bottom of the pore portion 170b with a short depth. Here, the pore portion is preferably in a circular or ellipsoidal shape in the planar view.

Next, as shown in FIG. 5C, a laminate film of the second oxide film 108 and the second nitride film 105, exposed on the pore portion 170b is etched using the photoresist 113 as a mask, by a conventional dry-etching technique. On this occasion, a part of the first oxide film 104 is etched. Also, a part of the lower electrode 112 is slightly etched. Thus, that part of the top end portion of the lower electrode 112 is dented toward the bottom end portion of the lower electrode 112 as compared to another part of the top end portion of the lower electrode 112.

Step of Forming Plate-Like Support

Next, as shown in FIG. 5D, the photoresist 113 is removed. Then, a semiconductor substrate is immersed into an etching solution such as aqueous fluorinated acid, thereby removing the second oxide film 108 and the first oxide film 104. The etching solution removes by dissolution the surface of the second oxide film 108, and then the etching solution inflows from the pore portion 170b, thereby removing by dissolution the first oxide film 104 filled inside. Here, the etching solution inflows into a region which is surrounded with the second nitride film 105, the first nitride film 103 and the cylindrical lower electrode 112, therefore the oxide film 101 provided on the semiconductor substrate is not removed by dissolution.

As a result, a plate-like support composed of the second nitride film 105 which has a plurality of the pore portions 170b and links with a plurality of the cylindrical lower electrodes 112. In the step of forming the pore portion 170b, the boundary length of the part on the circumference of the cylindrical lower electrode 112 where the cylindrical lower electrode is partially overlapped with the pore portion 170b is shorter than the boundary length of the part on the circumference of the cylindrical lower electrode 112 where the cylindrical lower electrode is not overlapped with the pore portion 170b. Therefore, the cylindrical lower electrode 112 is not separated with the second nitride film 105, and does not fall down.

Also, in the series of the steps described above, the total area of the plurality of the pore portion which is not overlapped with the cylindrical lower electrode 112 is shorter than the total area of the plate-like support composed of the second nitride film 105 where the pore portion is not formed.

Step of Forming Dielectric Film and Upper Electrode

Next, as shown in FIG. 5E, the dielectric film 114 is laminated on the surface of the lower electrode 112, the first nitride film 103 and the second nitride film 105, and further the upper electrode 115 is laminated on the surface of the dielectric film 114, thereby forming a capacitor. The capacitor can store the charge in the dielectric film 114 which lies between the upper electrode 115 and the lower electrode 112. Here, the dielectric film 114 and the upper electrode 115 are formed using a CVD method or an ALD methods. Because raw gases can inflow through the pore portion 170, the raw gases also intrudes the outer circumference of the lower electrode, thereby enabling a film with a desirable film thickness to be formed.

Thus, the capacitor of the memory cell has a cylindrical lower electrode 112 in which a part of the top end of the circumference of the lower electrode 112 is cut away (removed) and thus dented toward the bottom end thereof as compared to the other part of the top end of the circumference of the lower electrode 112. This lower electrode 112 is in a cylindrical shape, and is composed of a cylindrical portion and a bottom portion. The bottom portion is contacted with a conductor plug 102 as a storage node contact plug, thereby enabling an electrical connection to be obtained. Further, a dielectric film 114 is formed so as to cover the entire surface of the cylindrical lower electrode 112, and an upper electrode 115 is formed on a surface of the dielectric film 114 so as to fill the inside of the dielectric film 114 in the lower electrode and cover the outside of the dielectric film 114 which covers the outer circumference of the lower electrode, thereby forming a capacitor. The capacitor is formed on the insulating film 101, such as a nitride film and an oxide film, and a bottom portion of the lower electrode 112 is in contact with the conductor plug 102.

In FIG. 5E, only a single capacitor (first capacitor) is shown, but a semiconductor device of the present invention can contain other capacitors (second capacitors) so as to link with one another through the contacting portion 180, as described above. In such a case, each of the second capacitors comprises, similarly to the first capacitor, a lower electrode, an upper electrode, and a dielectric film between the lower electrode and the upper electrode. The lower electrode is also formed in a cylinder shape. In each of the second capacitors, a part of the top end of the circumference of the lower electrode is dented toward the bottom end thereof as compared to the other part of the top end of the circumference of lower electrode. In addition, each of the first capacitor and the second capacitors is also formed on the insulating film and a bottom portion of the lower electrode is in contact with the conductor plug. Moreover, in each capacitor, the dielectric film is formed so as to cover the entire surface of the cylindrical lower electrode and the plate-like support, and the upper electrode is formed on a surface of the dielectric film so as to fill the inside of the dielectric film in the lower electrode and cover the outside of the dielectric film which covers the outer circumference of the lower electrode.

As described above, in a method of manufacturing a semiconductor device according to the embodiments 4 and 5, the raw gases in a CVD method can inflow efficiently from the pore portion and, the dielectric film and the upper electrode can be formed on the surface of the lower electrode.

Also, a method of manufacturing a semiconductor device of the present invention contains the steps of forming the lower electrode with the bottom side, and contacting the lower electrode with the edge surface of the nitride film exposed by the formation of the through-hole. Therefore, the lower electrode cannot easily fall down, because the plate-like support composed of the nitride film is contacted with the upper side surface of the lower electrode.

Also, a method of manufacturing a semiconductor device of the present invention contains steps of forming a through-hole, and providing a pore portion. Therefore, the position of the through-hole and the position of the pore portion can be excellently controlled, thereby enabling the pore portion to be formed, suitable for the plate-like support having a pore portion from which the etching solution inflows and having a role in supporting the lower electrode.

Furthermore, in a method of manufacturing a semiconductor device according to the embodiment of the present invention, the lower electrode can be prevented from falling down, therefore it is possible to suppress a short circuit and breakdown of the lower electrode.

Also, in a method of manufacturing a semiconductor device according to the embodiment of the present invention, the lower electrode 112 is formed with a bottom side and in a cylindrical shape. However, it may be formed in a columnar shape. In this case, the alloy thin film 195 for the lower electrode shown in FIG. 2B or FIG. 4D can be formed with a film thickness of embedding the through-hole 140.

The present invention has an industrial availability in the semiconductor industries using a DRAM memory cell, power MOS, or the like, and the electronic information industries using the semiconductor device.

What is claimed is:

1. A semiconductor device, comprising:
    a plurality of cylindrical lower electrodes aligned densely in a memory array region,
    a plate-like support which is contacted on a side surface of the cylindrical lower electrodes at a contacting portion, and links to support the plurality of the cylindrical lower electrodes,
    a pore portion provided in the plate-like support,
    a dielectric film covering the entire surface of the cylindrical lower electrodes and the plate-like support in which the pore portion is formed, and
    an upper electrode formed on a surface of the dielectric film,
    wherein a boundary length of the part on the side surface of the cylindrical lower electrode which is exposed on the pore portion is shorter than a boundary length of the part on the side surface of the cylindrical lower electrode which is not exposed on the pore portion.

2. The semiconductor device according to claim 1, wherein a non-contacting portion not contacting the plate-like support is formed on the side surface of the cylindrical lower electrode by providing the pore portion in the plate-like support, and a boundary length of a side surface of the non-contacting portion is shorter than a boundary length of a side surface of the contacting portion in the cylindrical lower electrode.

3. The semiconductor device according to claim 1, wherein the pore portion is in a circular shape or in an ellipsoidal shape.

4. The semiconductor device according to claim 1, wherein a single pore portion is contacted on the side surfaces of at least two cylindrical lower electrodes, and a plurality of pore portions are provided in the plate-like support.

5. The semiconductor device according to claim 4, wherein a total area of the pore portions provided in the plate-like support is smaller than a total area of the plate-like support after the pore portions are provided.

6. The semiconductor device according to claim 1, wherein the film thickness of the plate-like support is within a range from 20 to 60 nm.

7. The semiconductor device according to claim 1, wherein the plate-like support is a silicon nitride film.

8. The semiconductor device according to claim 1, wherein said plurality of cylindrical lower electrodes comprises:
a cylindrical lower electrode having a top open edge, the top open edge varying in level over position.

9. The semiconductor device according to claim 8, wherein the upper electrode is formed on the dielectric film to fill an inside of the dielectric film in the lower electrode and cover an outside of the dielectric film.

10. The semiconductor device according to claim 9, further comprising a plurality of second capacitors, wherein each of the second capacitors comprises a cylindrical lower electrode, an upper electrode, and a dielectric film between the lower electrode and the upper electrode, and a top open edge of the lower electrode is varying in level over position.

11. The semiconductor device according to claim 10, further comprising an insulating film and a plurality of conductor plugs selectively formed in the insulating film, wherein each of the first capacitor and the second capacitors is formed on the insulating film and a bottom portion of the lower electrode of each of the first and second capacitors are electrically in contact with an associated one of the conductor plugs, the dielectric film in each capacitor being formed to cover the cylindrical lower electrode, and the upper electrode in each capacitor being formed on a surface of the dielectric film to fill an inside of the dielectric film in the lower electrode and cover an outside of the dielectric film.

12. The semiconductor device according to claim 8, further comprising an insulating film, and a conductor plug selectively formed in the insulating film, wherein said plurality of cylindrical lower electrodes are components of a plurality of first capacitors formed on the insulating film and the bottom end of each of each of said plurality of cylindrical lower electrodes is electrically in contact with the conductor plug.

13. The semiconductor device according to claim 8, wherein the top open edge is in a circular shape or in an ellipsoidal shape in plan view.

14. The semiconductor device according to claim 1, wherein said contacting portion is formed at a lower level in said device than a highest portion of said plurality of cylindrical lower electrodes.

15. The semiconductor device according to claim 1, wherein said plurality of cylindrical lower electrodes has an uppermost portion extending above the contacting portion.

* * * * *